(12) United States Patent
Kim et al.

(10) Patent No.: US 11,997,788 B2
(45) Date of Patent: *May 28, 2024

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Sang Hoon Kim, Suwon-si (KR); Young Kuk Ko, Suwon-si (KR); Gyu Mook Kim, Suwon-si (KR); Hea Sung Kim, Suwon-si (KR); Chi Won Hwang, Suwon-si (KR); Suk Chang Hong, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/901,406

(22) Filed: Sep. 1, 2022

(65) Prior Publication Data

US 2023/0171888 A1 Jun. 1, 2023

(30) Foreign Application Priority Data

Nov. 26, 2021 (KR) .................. 10-2021-0165240

(51) Int. Cl.
*H05K 1/11* (2006.01)
*H05K 3/06* (2006.01)
*H05K 3/46* (2006.01)

(52) U.S. Cl.
CPC ............ *H05K 1/113* (2013.01); *H05K 3/062* (2013.01); *H05K 3/4644* (2013.01); *H05K 2201/096* (2013.01); *H05K 2201/10674* (2013.01)

(58) Field of Classification Search
CPC ...... H05K 1/113; H05K 3/062; H05K 3/4644; H05K 2201/096; H05K 2201/10674
(Continued)

(56) References Cited

U.S. PATENT DOCUMENTS 10,849,225 B1 11/2020 Ko et al.
11,251,412 B2 * 2/2022 Lee ..................... H10K 59/131
(Continued)

FOREIGN PATENT DOCUMENTS

JP H05-283853 A 10/1993
JP 2017-17215 A 1/2017
(Continued)

OTHER PUBLICATIONS

Office Action dated Nov. 28, 2023 for corresponding Japanese Patent Application No. 2022-139305 (See English Translation).

*Primary Examiner* — Andargie M Aychillhum
(74) *Attorney, Agent, or Firm* — MORGAN, LEWIS & BOCKIUS LLP

(57) ABSTRACT

The present disclosure relates to a printed circuit board and a method of manufacturing the same. The printed circuit board includes: an insulating layer; a plurality of pads disposed on the insulating layer; and a plurality of insulating walls that are disposed on the insulating layer and cover side surfaces of the plurality of pads, respectively, but are not disposed on upper surfaces of the plurality of pads. The plurality of insulating walls are disposed to be spaced apart from each other on the first insulating layer.

34 Claims, 29 Drawing Sheets

(58) Field of Classification Search
USPC .......................................................... 174/250
See application file for complete search history.

(56) References Cited

U.S. PATENT DOCUMENTS

| | | | |
|---|---|---|---|
| 2009/0027864 A1* | 1/2009 | Cho | H05K 3/3452 |
| | | | 361/767 |
| 2011/0156042 A1* | 6/2011 | Miyairi | H01L 29/78696 |
| | | | 257/E33.053 |
| 2014/0185254 A1* | 7/2014 | Mok | H01L 21/563 |
| | | | 174/250 |
| 2015/0188004 A1* | 7/2015 | Ozeki | H01L 25/0753 |
| | | | 438/27 |
| 2015/0221893 A1* | 8/2015 | Teraguchi | H10K 50/856 |
| | | | 438/35 |
| 2017/0033036 A1 | 2/2017 | Kajihara et al. | |

FOREIGN PATENT DOCUMENTS

| | | |
|---|---|---|
| JP | 2017-34059 A | 2/2017 |
| KR | 10-2014-0084801 A | 7/2014 |
| KR | 10-2020-0144358 A | 12/2020 |

* cited by examiner

US 11,997,788 B2

PRINTED CIRCUIT BOARD AND METHOD OF MANUFACTURING THE SAME

CROSS-REFERENCE TO RELATED APPLICATION(S)

This application claims benefit of priority to Korean Patent Application No. 10-2021-0165240 filed on Nov. 26, 2021 in the Korean Intellectual Property Office, the disclosure of which is incorporated herein by reference in its entirety.

TECHNICAL FIELD

The present disclosure relates to a printed circuit board, and more particularly, to a printed circuit board in which an electronic component may be mounted and/or embedded, and a method of manufacturing the same.

BACKGROUND

In general, a high-performance semiconductor die has used a flip-chip mounting manner for high-density mounting. In this case, in accordance with miniaturization and performance improvements of semiconductors, an interval between connection terminals for flip-chip mounting has also been continuously decreased. Accordingly, an opening size and precision of a solder resist of a board, the degree of difficulty in forming solder bumps, the degree of difficulty of a bridge short-circuit in solder bonding of the semiconductor die, and the like, has continuously increased.

SUMMARY

An aspect of the present disclosure may provide a printed circuit board capable of being easily manufactured, and a method of manufacturing the same.

An aspect of the present disclosure may also provide a printed circuit board in which a bridge short-circuit risk may be decreased, and a method of manufacturing the same.

An aspect of the present disclosure may also provide a printed circuit board in which reliability may be provided, and a method of manufacturing the same.

According to an aspect of the present disclosure, a printed circuit board in which a structure in which side surfaces of pads provided for mounting a flip-chip die are surrounded by insulating walls is formed, such that a bridge short-circuit risk or the like is decreased at the time of assembling the flip-chip die and reliability is improved may be provided.

According to an aspect of the present disclosure, a printed circuit board may include: an insulating layer; a plurality of pads disposed on the insulating layer; and a plurality of insulating walls disposed on the insulating layer and cover side surfaces of the plurality of pads, respectively, but are not disposed on upper surfaces of the plurality of pads. The plurality of insulating walls are disposed to be spaced apart from each other on the first insulating layer.

According to another aspect of the present disclosure, a printed circuit board may include: a plurality of pads; and an insulating layer covering a lower surface and a side surface of each of the plurality of pads and having a recess disposed between at least a portion of the plurality of pads. An upper surface of the insulating layer is disposed on substantially the same level as an upper surface of each of the plurality of pads or is disposed on a level above the upper surface of each of the plurality of pads.

According to another aspect of the present disclosure, a method of manufacturing a printed circuit board may include: forming a plurality of pads and conductive patterns on a carrier substrate; forming an insulating layer on the carrier substrate, the insulating layer embedding at least portions of each of the plurality of pads and the conductive patterns therein; removing the carrier substrate; and forming a recess in the insulating layer by removing the conductive patterns.

According to another aspect of the present disclosure, a printed circuit board may include: an insulating layer including a plurality of rings spaced apart from each other and protruding from a surface of the insulating layer; and a plurality of pads respectively disposed in the plurality of rings.

According to another aspect of the present disclosure, a method of manufacturing a printed circuit board may include forming pads and conductive patterns spaced apart from each other on a carrier substrate; forming an insulating layer on the carrier substrate to fill spaces between the pads and the conductive patterns and covering the pads and the conductive patterns; removing the carrier substrate; and removing the conductive patterns so as to form a plurality of ring provided by the insulating layer which the pads are respectively disposed in.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It may be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
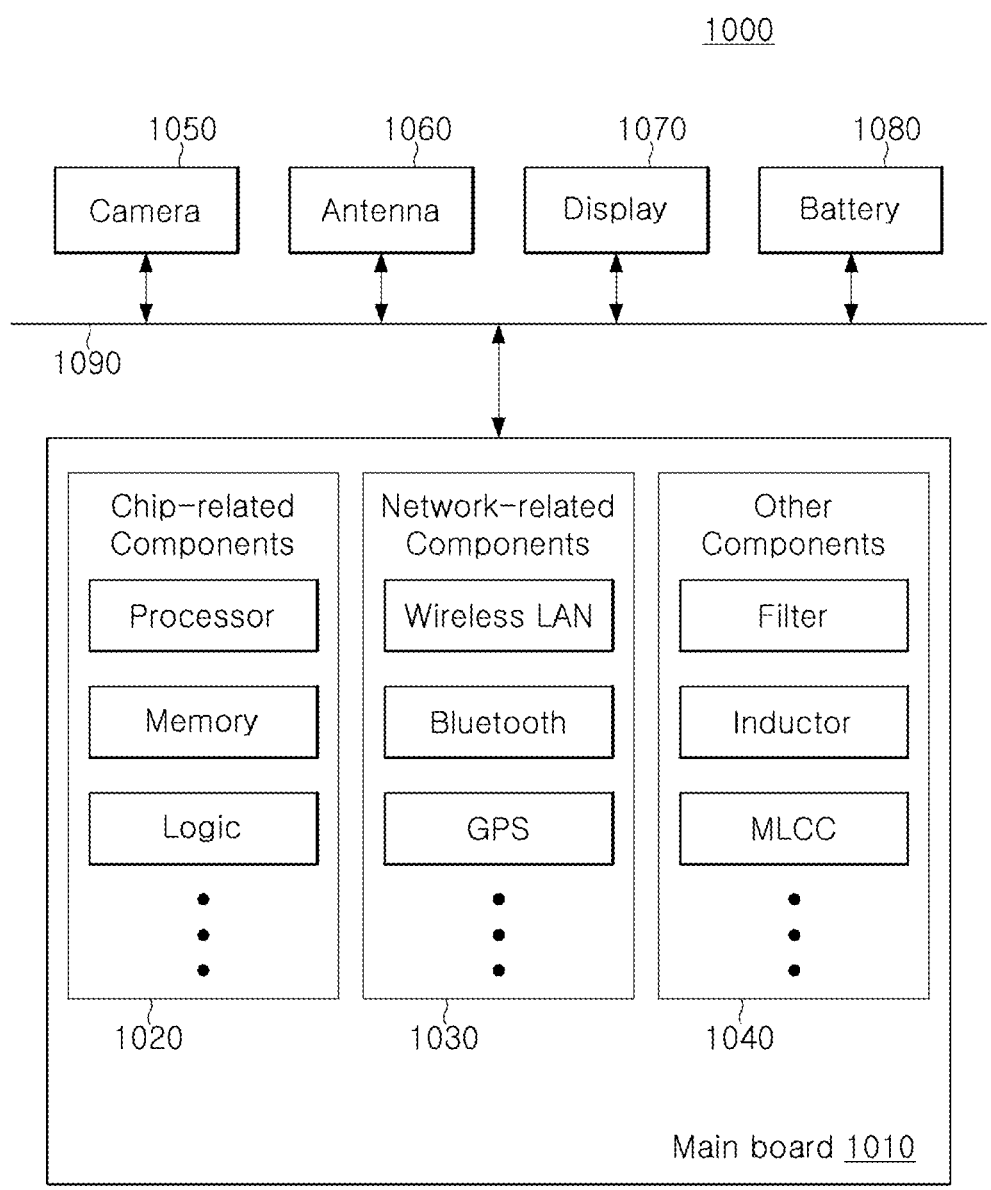
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, these chip related components 1020 may be combined with each other. These chip related components 1020 may have a package form including the chips or the electronic components described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
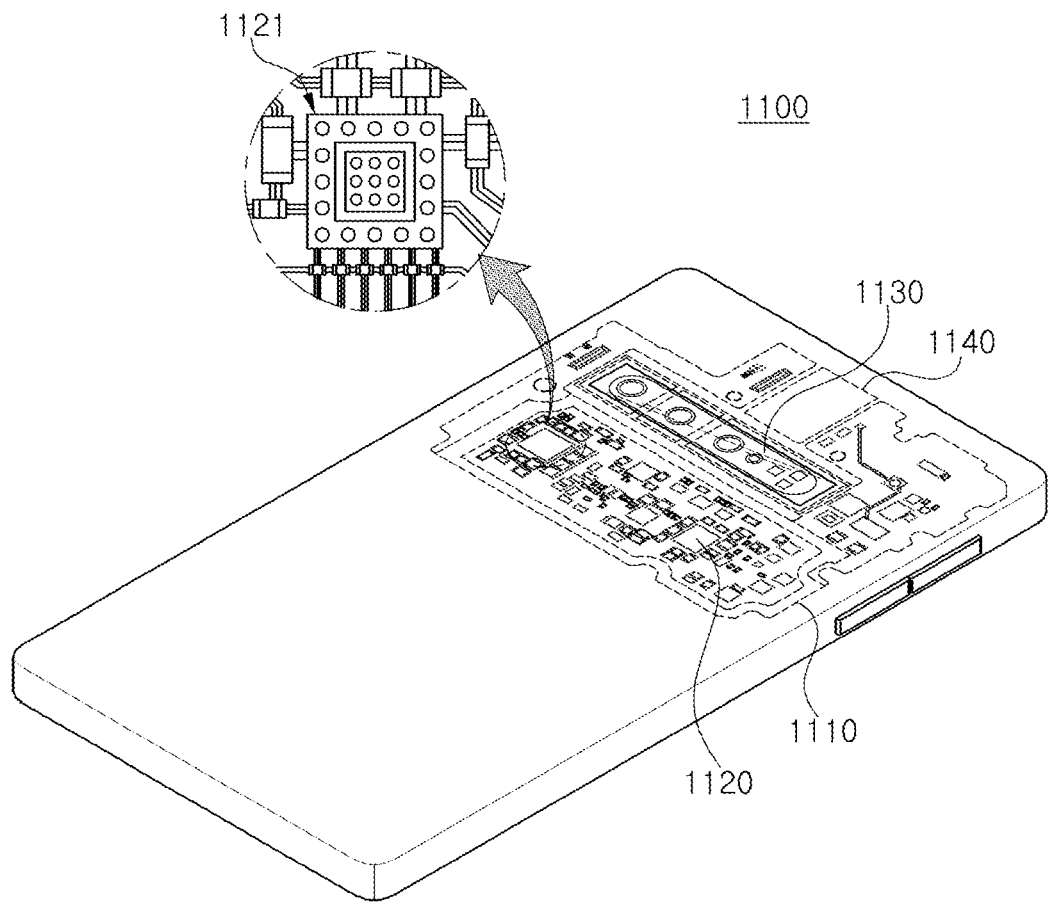
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various components 1120 may be physically or electrically connected to the motherboard 1110. In addition, other components that may or may not be physically or electrically connected to the motherboard 1110, such as a camera module 1130 and/or a speaker 1140, may be accommodated in the smartphone 1100. Some of the components 1120 may be the chip related components, for example, a component package 1121, but are not limited thereto. The component package 1121 may have a form of a printed circuit board on which an electronic component including an active component and/or a passive component are surface-mounted. Alternatively, the component package 1121 may have a form of a printed circuit board in which an active component and/or a passive component are embedded. Meanwhile, the electronic device is not necessarily limited to the smartphone 1100, but may be other electronic devices as described above.

Printed Circuit Board

Figure 3:
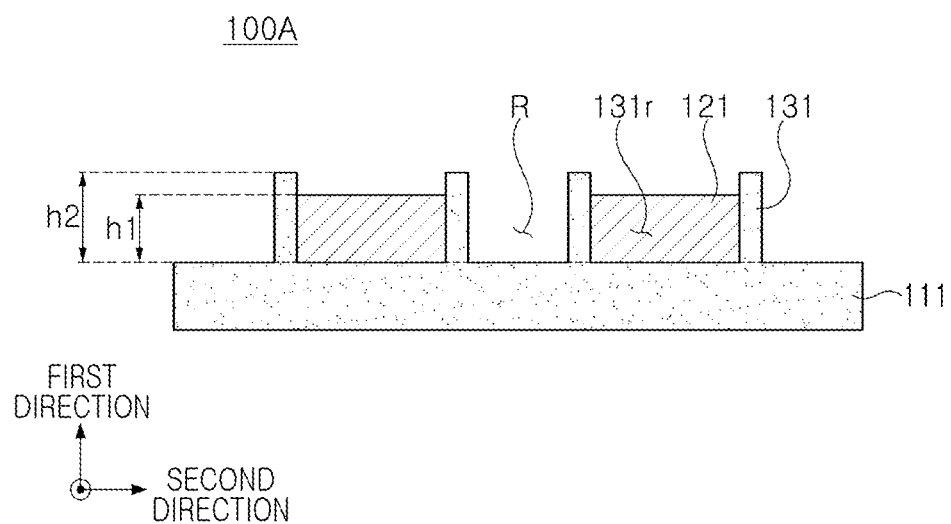
FIG. 3 is a schematic cross-sectional view illustrating an example of a printed circuit board.

FIG. 3 is a schematic cross-sectional view illustrating an example of a printed circuit board.

Figure 4:
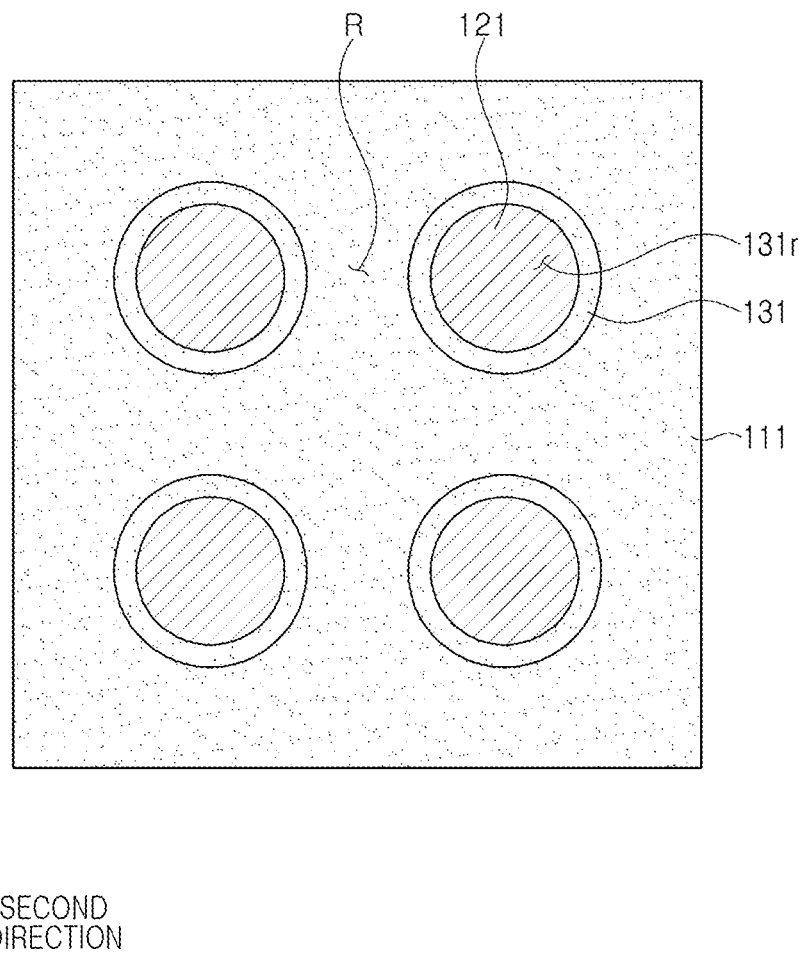
FIG. 4 is a schematic plan view illustrating the printed circuit board of FIG. 3.

FIG. 4 is a schematic plan view illustrating the printed circuit board of FIG. 3.

Referring to FIGS. 3 and 4, a printed circuit board 100A according to an exemplary embodiment may include an insulating layer 111, a plurality of pads 121 disposed on the insulating layer 111, and a plurality of insulating walls 131 that cover side surfaces of the plurality of pads 121, respectively, but are not disposed on upper surfaces of the plurality of pads 121. As a non-restrictive example, the printed circuit board 100A according to an exemplary embodiment may be used as a package substrate on which a flip-chip die is to be mounted, and the plurality of pads 121 may be provided as bumps for mounting the flip-chip die.

Herein, "insulating wall" may be used as a term distinguished from "insulating layer". For example, the insulating layer may simply refer to a layer having insulating properties regardless of its shape. On the other hand, the insulating wall may refer to an insulating layer having a shape for surrounding at least a part of a side surface of a certain target component. That is, the insulating layer may have a more comprehensive meaning than the insulating wall, and the insulating wall may have a more subordinate meaning than the insulating layer. That is, if necessary, the insulating layer may include the insulating wall. In this respect, in cross section and/or in plan view, the insulating wall may have a smaller area than the insulating layer. In addition, a plurality of insulating walls may exist on the same level, and in this case, respective insulating walls may exist independently of each other on the same level.

Herein, cross section may refer to a cross-sectional shape of a target when the target is vertically cut in first and second directions, a cross-sectional shape of the target when the target is vertically cut in first and third directions, or a cross-sectional shape of the target when the target is viewed from side.

Herein, plan view may refer to a shape of the target in plan view when the target is horizontally cut in the second and third directions or a shape of the target in plan view when the target is viewed from the top or the bottom.

Herein, a first direction may refer to a stacked direction or a thickness direction, a second direction may refer to a width direction, and a third direction may refer to a length direction.

Meanwhile, as described above, in general, the high-performance semiconductor die has used the flip-chip mounting manner for high-density mounting. In this case, in accordance with miniaturization and performance improvement of semiconductors, an interval between connection terminals for flip-chip mounting has also continuously decreased. Accordingly, an opening size and its precision of a solder resist of a board, the degree of difficulty in forming solder bumps, the degree of difficulty of a bridge short-circuit in solder bonding of the semiconductor die, and the like, has continuously increased.

In this regard, in order to make a pitch of flip-chip connection bumps of the board finer, a structure in which a small amount of solder is used by forming copper posts on the board and underfills, non-conductive films (NCFs), non-conductive pastes (NCPs), and the like, are easily applied by securing an interval between the semiconductor die and the board has been studied.

Meanwhile, the board having such copper posts may be manufactured by forming a seed layer on a surface of the board on which the solder resist is formed, using chemical copper plating, sputtering, or the like, performing a photolithography process such as exposure, development, and peeling using a dry film, and then performing an etching process on the seed layer.

However, in this case, there may be a difficulty in securing close adhesion of the seed layer formed on the solder resist in a manufacturing process, and there may be a restriction in a design rule for realizing a fine pitch of the bumps, for example, the necessity to open a fine solder resist, a difficulty in reducing a diameter of the copper posts due to a solder resist size and an exposure matching tolerance of the copper posts, and a bridge short-circuit risk or the like at the time of assembling the semiconductor die having the fine pitch of the bumps.

On the other hand, in the printed circuit board 100A according to an exemplary embodiment, a structure in which the side surfaces of the plurality of pads 121 provided for mounting the flip-chip die are approximately surrounded by the plurality of insulating walls 131 may be formed, such that the bridge short-circuit risk or the like at the time of assembling the flip-chip die may be decreased, and reliability may be improved. For example, the structure according to an exemplary embodiment may be basically a structure in which the side surfaces of the plurality of pads 121 provided as the bumps for mounting the flip-chip die are surrounded by the plurality of insulating walls 131, respectively. Therefore, solders or the like may not be attached to the side surfaces of the plurality of pads 121, and the bridge short-circuit risk may thus be decreased.

In addition, in the printed circuit board 100A according to an exemplary embodiment, the seed layer does not need to be formed on the solder resist unlike the board having the copper posts, and a solder resist opening of bump connection parts may be changed by a recess formation process, and thus, a restriction in a design rule may also be solved. In addition, the plurality of pads 121 may be formed on a metal layer of a carrier substrate, and resultantly, very excellent height uniformity may be realized. In addition, since a roughness shape may be transferred from a metal pattern subjected to roughening treatment to a surface of the insulating layer 111 subjected to an etching process in an initial manufacturing operation, the surface of the insulating layer 111 may have high close adhesion with a molding and/or an underfill when the printed circuit board is applied to a package structure later, and may realize high reliability. In addition, roughening treatment may also be performed on the plurality of insulating walls 131, and stable close adhesion may thus be secured.

Meanwhile, in the printed circuit board 100A according to an exemplary embodiment, the plurality of insulating walls 131 may cover the side surfaces of the plurality of pads 121, respectively, but may not be disposed on the upper surfaces of the plurality of pads 121. In this respect, each of the plurality of insulating walls 131 may be in direct contact with the side surface of each of the plurality of pads 121, but may be spaced apart from the upper surface of each of the plurality of pads 121. Accordingly, connection terminals of the flip-chip die may be more stably put on the pads 121 in mounting the flip-chip die, and bonding areas with connection members such as solders may be increased, such that close adhesion and reliability may be improved.

In this respect, each the plurality of insulating walls 131 may have each of a plurality of cavities 131r in which each of the plurality of pads 121 is disposed, and each of the plurality of cavities 131r may entirely open the upper surface of each of the plurality of pads 121. In addition, in cross section, a width of each of the plurality of cavities 131r may be substantially constant.

Herein, "substantially constant" may be a concept including a process error or a position deviation occurring in a manufacturing process, an error at the time of performing measurement, and the like. For example, the meaning that the width of the cavity of the insulating wall is substantially constant may be that there is little deviation in the width of the cavity, for example, little deviation between widths at the uppermost side and the lowermost side of the same insulating wall because the side surface of the insulating wall has an approximately vertical shape in cross section.

Meanwhile, in the printed circuit board 100A according to an exemplary embodiment, each of the plurality of pads 121 may have an approximately circular shape in plan view. In addition, each of the plurality of insulating walls 131 surrounding the plurality of pads 121 may have an approximately circular ring shape. However, each of the plurality of pads 121 and the plurality of insulating walls 131 is not limited thereto. For example, each of the plurality of pads 121 may have various shapes such as a quadrangular shape and an elliptical shape, and each of the plurality of insulating walls 131 may have the corresponding various shapes such as a quadrangular ring shape and an elliptical ring shape.

Meanwhile, in the printed circuit board 100A according to an exemplary embodiment, the plurality of insulating walls 131 may be integrated with the insulating layer 111 without a boundary line therebetween. For example, the plurality of insulating walls 131 may be a single component integrated with the insulating layer 111. Accordingly, the plurality of insulating walls 131 may include the same insulating material as the insulating layer 111. As such, the plurality of insulating walls 131 are not additionally formed using a separate material, and may be formed by a recess forming process or the like in the insulating layer 111, and a restriction in a design rule may thus be effectively solved.

In this respect, the insulating layer 111 may include the plurality of insulating walls 131, and the insulating layer 111 including the plurality of insulating walls 131 may cover lower surfaces and the side surfaces of the pads 121.

Meanwhile, in the printed circuit board 100A according to an exemplary embodiment, the plurality of insulating walls 131 may be disposed to be spaced apart from each other on the insulating layer 111, and accordingly, a bridge short-circuit risk may be more effectively decreased. In plan view, each of the plurality of insulating walls 131 may continuously surround the side surface of each of the plurality of pads 121, which may be preferable in terms of the decrease in the bridge short-circuit risk, but the present disclosure is not limited thereto.

Meanwhile, in the printed circuit board 100A according to an exemplary embodiment, a recess R may exist between the plurality of insulating walls 131 and/or around the plurality of insulating walls 131. The recess R may be a single continuous recess R. The plurality of pads 121 may not be disposed in the recess R. The recess R may be disposed on substantially the same level as the plurality of pads 121. It may be determined in the first direction whether or not components are disposed on substantially the same level. The plurality of insulating walls 131 may have ring shapes continuously surrounding the plurality of pads 121 independently through the recess R, which may be preferable in decreasing the bridge short-circuit risk.

Meanwhile, in the printed circuit board 100A according to an exemplary embodiment, a height of each of the plurality of insulating walls 131 on the insulating layer 111 may be greater than that of each of the plurality of pads 121. As described above, when the insulating layer 111 includes the plurality of insulating walls 131 as the component integrated therewith, an upper surface of the insulating layer 111 may be disposed on a level above the upper surface of each of the plurality of pads 121. A height difference (h2−h1) between these upper surfaces may be about 2 μm to 4 μm, but is not limited thereto. In this case, connection terminals may be stably put on the plurality of pads 121 at the time of mounting the flip-chip die. In addition, when solders are disposed on the plurality of pads 121, an effect of suppressing overflow of the solders may be expected.

Components of the printed circuit board 100A according to an exemplary embodiment will hereinafter be described in more detail with reference to FIGS. 3 and 4.

The insulating layer 111 may include an insulating material. The insulating material may include a thermosetting resin such as an epoxy resin, a thermoplastic resin such as polyimide, or a material including an inorganic filler, an organic filler, and/or a glass fiber (or a glass cloth and/or a glass fabric) together with the thermosetting resin and the thermoplastic resin. The insulating material may be, for example, Ajinomoto Build-up Film (ABF), prepreg (PPG), resin coated copper (RCC), or the like, but is not limited thereto, and may be other polymer materials.

Each of the pads 121 may include a metal material. The metal material may include copper (Cu), aluminum (Al), silver (Ag), tin (Sn), gold (Au), nickel (Ni), lead (Pb), titanium (Ti), or alloys thereof. The pads 121 may perform various functions depending on their designs. For example, the pads 121 may include ground pads, power pads, signal pads, and the like. Here, the signal pads may include pads for connection of various signals such as data signals except for ground, power, or the like. The pad 121 may include an electroplating layer (or electrolytic copper), but may not include an electroless plating layer (chemical copper) if necessary.

Each of the insulating walls 131 may include an insulating material. The insulating material may include a thermosetting resin such as an epoxy resin, a thermoplastic resin such as polyimide, or a material including an inorganic filler, an organic filler, and/or a glass fiber (or a glass cloth and/or a glass fabric) together with the thermosetting resin and the thermoplastic resin. The insulating material may be, for example, ABF, PPG, RCC, or the like, but is not limited thereto, and may also be other polymer materials. The insulating wall 131 may include the same insulating material as the insulating layer 111, and the insulating wall 131 and the insulating layer 111 may be an integrated single and identical component without a boundary line therebetween.

Figure 5:
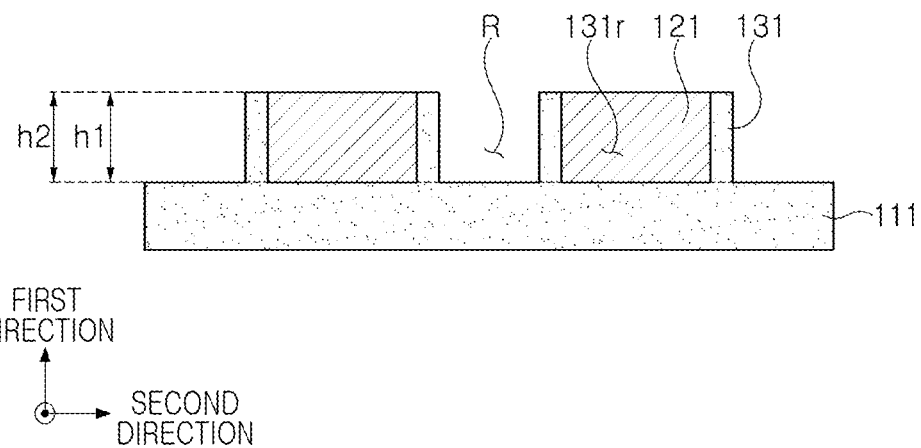
FIG. 5 is a schematic cross-sectional view illustrating another example of a printed circuit board.

FIG. 5 is a schematic cross-sectional view illustrating another example of a printed circuit board.

Referring to FIG. 5, a printed circuit board 100B according to another exemplary embodiment may include an insulating layer 111, a plurality of pads 121 disposed on the insulating layer 111, and a plurality of insulating walls 131 that cover side surfaces of the plurality of pads 121, respectively, but are not disposed on upper surfaces of the plurality of pads 121. As a non-restrictive example, the printed circuit board 100B according to another exemplary embodiment may be used as a package substrate on which a flip-chip die is to be mounted, and the plurality of pads 121 may be provided as bumps for mounting the flip-chip die.

Meanwhile, in the printed circuit board 100B according to another exemplary embodiment, a height of each of the plurality of insulating walls 131 on the insulating layer 111 may be substantially the same as a height of each of the plurality of pads 121. As described above, when the insulating layer 111 includes the plurality of insulating walls 131 as the component integrated therewith, an upper surface of the insulating layer 111 may be disposed on substantially the same level as the upper surface of each of the plurality of pads 121. For example, there may be little height difference (h2−h1) between these upper surfaces. For example, in a manufacturing process to be described later, a metal layer of a carrier substrate may include a copper (Cu) layer and a barrier layer including a metal having an etching property different from that of the copper layer, such as nickel (Ni) or titanium (Ti). In this case, when the metal layer is etched after detachment, the barrier layer may be etched after the copper (Cu) layer is etched. As a result, when the copper (Cu) layer is etched, the barrier layer may protect the plurality of pads 121. Therefore, surfaces of the plurality of pads 121 may be substantially unaffected by the etching, and thus, a step portion may not be substantially generated. Therefore, if necessary, the surfaces of the plurality of pads 121 may be implemented to be substantially coplanar with surfaces of the plurality of insulating walls 131.

Herein, "substantially the same height", "disposed on substantially the same level, and/or "substantially coplanar with" may be concepts including a process error or a position deviation occurring in a manufacturing process, an error at the time of performing measurement, and the like. For example, the meaning that the upper surface of the insulating layer is disposed on substantially the same level as the upper surface of the pad may be that the upper surface of the insulating layer and the upper surface of the pad are disposed at approximately the same position in the first direction within a range including a slight error.

Other contents, for example, the contents described in the above-described printed circuit board 100A may be applied to the printed circuit board 100B according to another exemplary embodiment as long as they are not contradictory, and a description of overlapping contents will be omitted.

Figure 6:
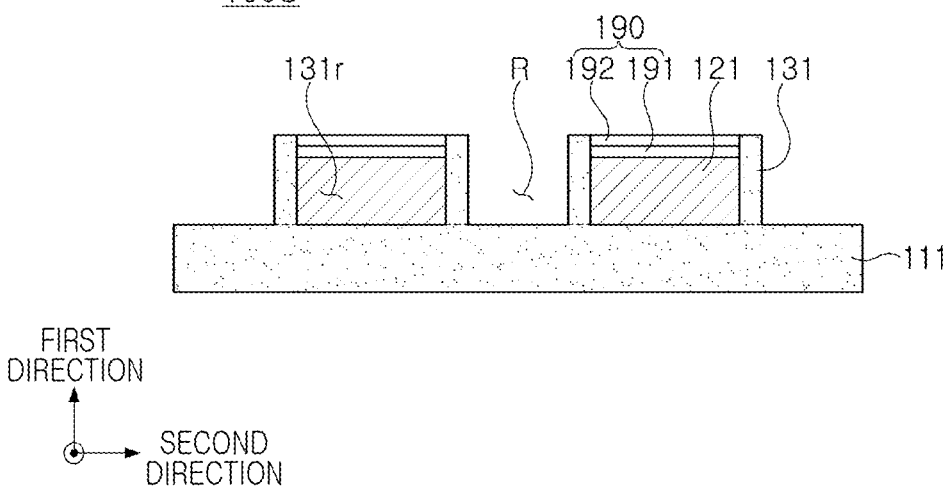
FIG. 6 is a schematic cross-sectional view illustrating another example of a printed circuit board.

FIG. 6 is a schematic cross-sectional view illustrating another example of a printed circuit board.

Figure 7:
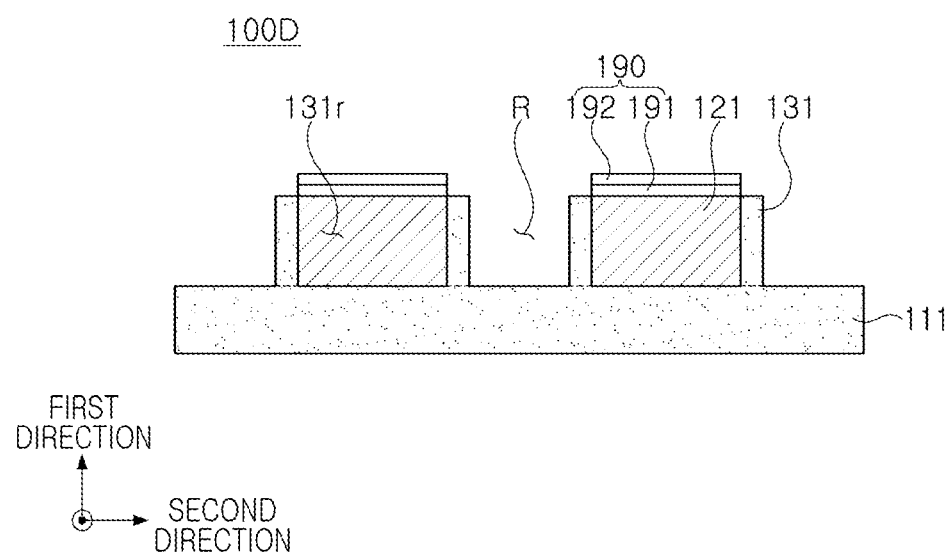
FIG. 7 is a schematic cross-sectional view illustrating another example of a printed circuit board.

FIG. 7 is a schematic cross-sectional view illustrating another example of a printed circuit board.

Referring to FIGS. 6 and 7, each of printed circuit boards 100C and 100D according to other exemplary embodiments may include an insulating layer 111, a plurality of pads 121 disposed on the insulating layer 111, a plurality of insulating walls 131 that cover side surfaces of the plurality of pads 121, respectively, but are not disposed on upper surfaces of the plurality of pads 121, and a surface treatment layer 190 disposed on a surface of at least one of the plurality of pads 121. As a non-restrictive example, each of the printed circuit boards 100C and 100D according to other exemplary embodiments may be used as a package substrate on which a flip-chip die is to be mounted, and the plurality of pads 121 may be provided as bumps for mounting the flip-chip die.

Meanwhile, each of the printed circuit boards 100C and 100D according to other exemplary embodiments may further include the surface treatment layer 190, through which the flip-chip die may be more effectively mounted. The surface treatment layer 190 may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. In this respect, the surface treatment layer 190 may include at least one of a nickel (Ni) layer 191 and a gold (Au) layer 192, but is not limited thereto. As a non-restrictive example, the surface treatment layer 190 may include a nickel (Ni) layer 191 disposed on the surface of the pad 121 and a gold (Au) layer 192 disposed on a surface of the nickel (Ni) layer 191, but is not limited thereto.

Meanwhile, in the printed circuit board 100C according to another exemplary embodiment, an upper surface of the uppermost layer of the surface treatment layer 190 may be disposed on substantially the same level as an upper surface of the insulating wall 131, and in the printed circuit board 100D according to another exemplary embodiment, an upper surface of the uppermost layer of the surface treatment layer 190 may be disposed on a level above an upper surface of the insulating wall 131, but the present disclosure is not limited thereto.

Other contents, for example, the contents described in the above-described printed circuit boards 100A and 100B may be applied to the printed circuit boards 100C and 100D according to other exemplary embodiments as long as they are not contradictory, and a description of overlapping contents will be omitted.

Figure 8:
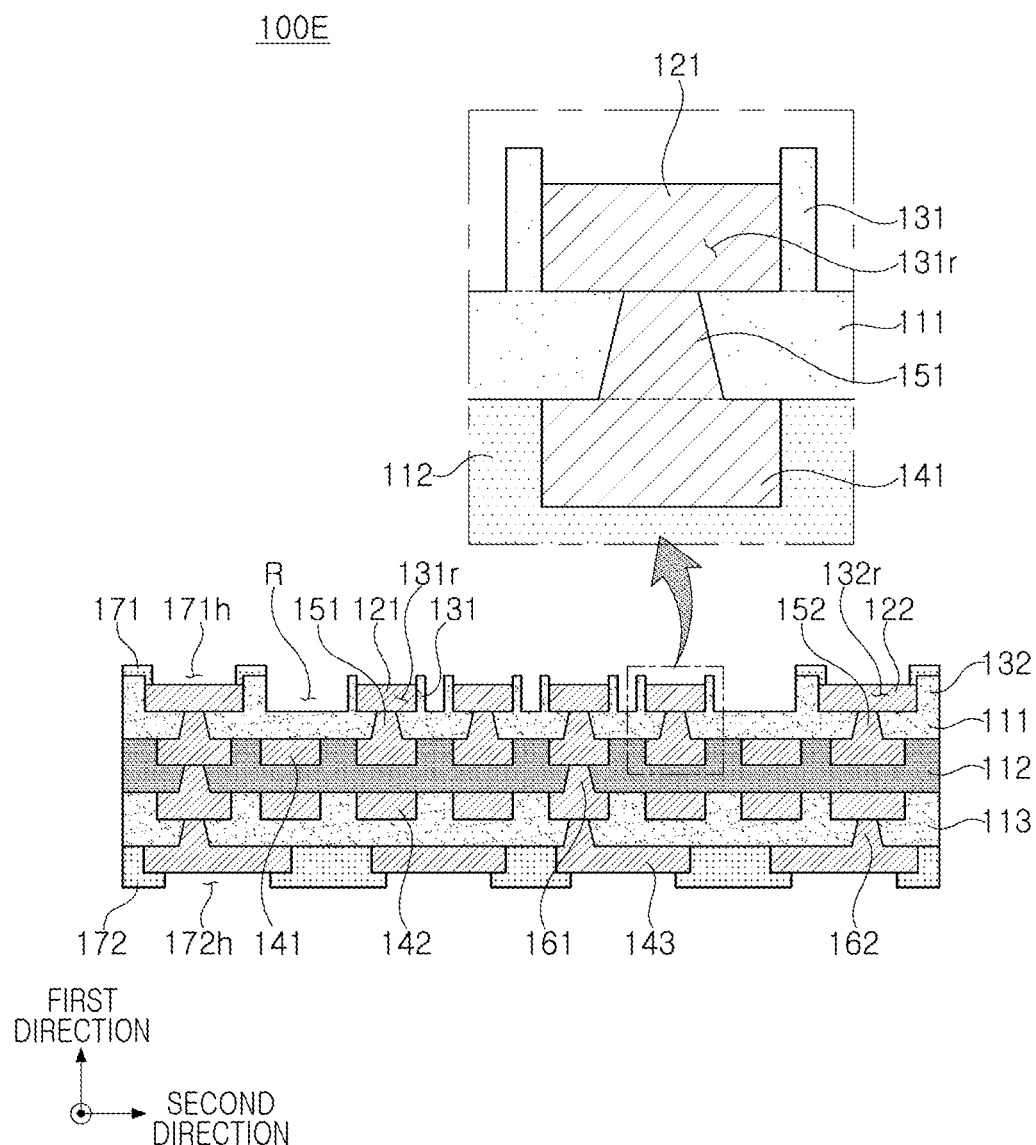
FIG. 8 is a schematic cross-sectional view illustrating another example of a printed circuit board.

FIG. 8 is a schematic cross-sectional view illustrating another example of a printed circuit board.

Referring to FIG. 8, a printed circuit board 100E according to another exemplary embodiment may include a first insulating layer 111, first pads 121 and second pads 122 disposed on an upper surface of the first insulating layer 111, first insulating walls 131 disposed on the upper surface of the first insulating layer 111 and covering side surfaces of the first pads 121, and second insulating walls 132 disposed on the upper surface of the first insulating layer 111 and covering side surfaces of the second pads 122.

The printed circuit board 100E according to another exemplary embodiment may further include a first wiring layer 141 disposed on a lower surface of the first insulating layer 111, first connection vias 151 penetrating through the first insulating layer 111 and electrically connecting the first pads 121 to at least portions of the first wiring layer 141, and/or second connection vias 152 penetrating through the first insulating layer 111 and electrically connecting the second pads 122 to at least other portions of the first wiring layer 141, if necessary.

The printed circuit board 100E according to another exemplary embodiment may further include a second insulating layer 112 disposed on the lower surface of the first insulating layer 111 and embedding at least portions of the first wiring layer 141 therein, a second wiring layer 142 disposed on a lower surface of the second insulating layer 112, and/or a first via layer 161 penetrating through the second insulating layer 112 and electrically connecting at least portions of each of the first wiring layer 141 and the second wiring layer 142 to each other, if necessary.

The printed circuit board 100E according to another exemplary embodiment may further include a third insulating layer 113 disposed on the lower surface of the second insulating layer 112 and embedding at least portions of the second wiring layer 142 therein, a third wiring layer 143 disposed on a lower surface of the third insulating layer 113, and/or a second via layer 162 penetrating through the third insulating layer 113 and electrically connecting at least portions of each of the second wiring layer 142 and the third wiring layer 143 to each other, if necessary.

The printed circuit board 100E according to another exemplary embodiment may further include a first passivation layer 171 disposed on the second insulating walls 132 and having first openings 171h exposing at least portion of surfaces of the second pads 122 and/or a second passivation layer 172 disposed on the lower surface of the third insulating layer 113 and having second openings 172h exposing at least portions of a surface of the third wiring layer 143, if necessary. In one example, the first passivation layer 171 may be disposed on portions of upper surfaces of the second pads 122.

Meanwhile, in the printed circuit board 100E according to another exemplary embodiment, a structure in which the side surfaces of the pads 121 provided for mounting the flip-chip die are approximately surrounded by the first insulating walls 131 may be formed, such that the bridge short-circuit risk or the like at the time of assembling the flip-chip die may be decreased, and reliability may be improved. For example, the structure according to another exemplary embodiment may be basically a structure in which the side surfaces of the first pads 121 provided as the bumps for mounting the flip-chip die are surrounded by the first insulating walls 131, respectively. Therefore, solders or the like may not be attached to the side surfaces of the first pads 121, and the bridge short-circuit risk may thus be decreased. Similarly, a structure in which the side surfaces of the second pads 122 provided for assembling a package such as a board-on-board are approximately surrounded by the second insulating walls 132 may be formed, such that reliability or the like may be improved.

Meanwhile, in the printed circuit board 100E according to another exemplary embodiment, as can be seen from a process to be described above, the seed layer does not need to be formed on the solder resist unlike the board having the copper posts, and a solder resist opening of bump connection parts may be changed by a recess formation process, and thus, a restriction in a design rule may also be solved. In addition, the first pads 121 and the second pads 122 may be formed on a metal layer of a carrier substrate, and resultantly, very excellent height uniformity may be realized. In addition, since a roughness shape may be transferred from a metal pattern subjected to roughening treatment to a surface of the first insulating layer 111 subjected to an etching process in an initial manufacturing operation, the surface of the first insulating layer 111 may have high close adhesion with a molding and/or an underfill when the printed circuit board is applied to a package structure later, and may realize high reliability. In addition, roughening treatment may also be performed on the first insulating walls 131 and the second insulating walls 132, and stable close adhesion may thus be secured.

Meanwhile, in the printed circuit board 100E according to another exemplary embodiment, the first insulating walls 131 may cover the side surfaces of the first pads 121, but may not be disposed on upper surfaces of the first pads 121. In addition, the second insulating walls 132 may cover the side surfaces of the second pads 122 but not be disposed on upper surfaces of the second pads 122. Accordingly, connection terminals of the flip-chip die may be more stably put on the first pads 121 in mounting the flip-chip die, and bonding areas with connection members such as solders may be increased, such that close adhesion and reliability may be improved.

In this respect, the first insulating walls 131 and the second insulating walls 132 may have, respectively, first cavities 131r in which the first pads 121 are disposed and second cavities 132r in which the second pads 122 are disposed. The first cavity 131r may entirely open the upper surface of the first pad 121, and the second cavity 132r may entirely open the upper surface of the second pad 122. In addition, in cross section, a width of such a first cavity 131r may be substantially constant, and a width of such a second cavity 132r may be substantially constant.

Meanwhile, in the printed circuit board 100E according to another exemplary embodiment, the first insulating walls 131 and the second insulating walls 132 may be integrated with the first insulating layer 111 without boundary lines therebetween. For example, the first insulating walls 131 and the second insulating walls 132 may be a single component integrated with the first insulating layer 111. Accordingly, the first insulating walls 131 and the second insulating walls 132 may include the same insulating material as the first insulating layer 111. As such, the first insulating walls 131 and the second insulating walls 132 are not additionally formed using a separate material, and may be formed by a recess forming process to be described later in the insulating layer 111, and a restriction in a design rule may thus be effectively solved.

Meanwhile, in the printed circuit board 100E according to another exemplary embodiment, a plurality of first pads 121 and a plurality of second pads 122 may be respectively disposed. In addition, a plurality of first insulating walls 131 and second insulating walls 132 surrounding the plurality of first pads 121 and the plurality of second pads 122, respectively, may also be disposed. For example, each of the first insulating walls 131 may cover the side surface of each of the first pads 121, but may not be disposed on the upper surface of each of the first pads 121. In addition, each of the second insulating walls 132 may cover the side surface of each of the second pads 122, but may not be disposed on the upper surface of each of the second pads 122. The first insulating walls 131 may be disposed to be spaced apart from each other and the second insulating walls 132 may be disposed to be spaced apart from each other, and a bridge short risk may be more effectively decreased. In a plan view, each of the first insulating walls 131 may continuously surround the side surface of each of the first pads 121 and each of the second insulating walls 132 may continuously surround the side surface of each of the second pads 122, which may be preferable in terms of the decrease in the bridge short risk, but the present disclosure is not necessarily limited thereto.

Meanwhile, in the printed circuit board 100E according to another exemplary embodiment, a recess R may exist between the first insulating walls 131 and/or between the first insulating wall 131 and the second insulating wall 132. The recess R between the first insulating walls 131 and/or between the first insulating wall 131 and the second insulating wall 132 may be a single continuous recess R. The first pads 121 and/or the second pads 122 may not be disposed in the recess R. The first insulating walls 131 and the second insulating walls 132 may have ring shapes continuously surrounding the first pads 121 and the second pads 122 independently through the recess R, which may be more preferable in decreasing the bridge short-circuit risk.

Meanwhile, in the printed circuit board 100E according to another exemplary embodiment, the first pads 121 and the first insulating walls 131 surrounding the first pads 121 may be disposed in a center region on the first insulating layer 111, and the second pads 122 and the second insulating walls 132 surrounding the second pads 122 may be disposed in a side region on the first insulating layer 111. The first pads 121 may be used as a bump for mounting the flip-chip die, and the second pad 122 may be used as bumps for connection of the board-on-board. In this respect, the second pad 122 may be greater than the first pad 121. For example, in cross section, a width of the second pad 122 may be greater than that of the first pad 121.

Herein, the center region may be an inner region in which an electronic component such as a flip-chip die is disposed, and the side region may be an outer region in which connection members such as solder ball joints for connection of the board-on-board are disposed. Here, the inner region and the outer side may be determined in plan view.

Meanwhile, in the printed circuit board 100E according to another exemplary embodiment, a height of the first insulating wall 131 may be greater than that of the upper surface of the first pad 121. In addition, a height of the second insulating wall 132 may be higher than that of the upper surface of the second pad 122. In this case, connection terminals may be stably put on the first pads 121 at the time of mounting the flip-chip die. In addition, when solders are disposed as the connection members on the first pads 121 and/or the second pads 122, an effect of suppressing overflow of the solders may be expected. However, the present disclosure is not limited thereto, and as described above, when an etching barrier layer is used in a process, such a height difference, that is, a step portion may not substantially exist.

Meanwhile, in the printed circuit board 100E according to another exemplary embodiment, each of the first connection via 151 and the second connection via 152 may have a tapered shape of which a width of an upper surface is smaller than that of a lower surface in cross section. For example, the first connection via 151 may have a smaller width in a surface thereof connected to the first pad 121 than a surface thereof connected to at least a portion of the first wiring layer 141. The second connection via 152 may have a smaller width in a surface thereof connected to the second pad 122 than a surface thereof connected to at least other portion of the first wiring layer 141. Accordingly, a restriction in a design rule may be further solved. For example, diameters, for example, widths in cross section, of the first pad 121 and the second pad 122 each connected to the first connection via 151 and the second connection via 152 may be further decreased.

Meanwhile, in the printed circuit board 100E according to another exemplary embodiment, the first insulating layer 111 and the second insulating layer 112 may include different insulating materials. For example, the first insulating layer 111 may include a material on which a semi additive process (SAP) may be performed, such as an insulating material that does not include a glass fiber, so as to be advantageous in forming a fine circuit. Specifically, the first insulating layer 111 may include ABF, but is not limited thereto. On the other hand, the second insulating layer 112 may include a material having a high modulus, such as an insulating material including a glass fiber, so as to be advantageous in controlling warpage. Specifically, the second insulating layer 112 may include an insulating material of PPG or RCC, but is not limited thereto. Similarly, the third insulating layer 113, which is the outermost layer on an opposite side, may include the same insulating material as the first insulating layer 111, and when the number of second insulating layers 112 is plural, the respective layers may include the same insulating material, but are not limited thereto.

Herein, the same insulating material may refer to the same type of insulating material as well as the completely same insulating material. Accordingly, compositions of the insulating materials may be substantially the same as each other, but specific composition ratios of these compositions may be slightly different from each other.

Components of the printed circuit board 100E according to another exemplary embodiment will hereinafter be described in more detail with reference to FIG. 8.

Each of the first to third insulating layers 111, 112, and 113 may include an insulating material. The insulating material may include a thermosetting resin such as an epoxy resin, a thermoplastic resin such as polyimide, or a material including an inorganic filler, an organic filler, and/or a glass fiber (or a glass cloth and/or a glass fabric) together with the thermosetting resin and the thermoplastic resin. The insulating material may be, for example, ABF, PPG, RCC, or the like, but is not limited thereto, and may also be other polymer materials. As a non-restrictive example, each of the first insulating layer 111 and the third insulating layer 113 may include ABF, and the second insulating layer 112 may include PPG, but the present disclosure is not limited thereto. The first insulating layer 111 and the third insulating layer 113 may be the outermost insulating layers, and the second insulating layer 112 may be an internal build-up layer. The second insulating layer 112 corresponding to the build-up layer may be a single layer as illustrated in FIG. 8, but may be a plurality of layers unlike FIG. 8, and the specific number of layers in the second insulating layer 112 is not particularly limited.

Each of the first and second pads 121 and 122 may include a metal material. The metal material may include copper (Cu), aluminum (Al), silver (Ag), tin (Sn), gold (Au), nickel (Ni), lead (Pb), titanium (Ti), or alloys thereof. The first and second pads 121 and 122 may perform various functions depending on their designs. For example, the first and second pads 121 and 122 may include ground pads, power pads, signal pads, and the like. Here, the signal pads may include pads for connection of various signals such as data signals except for ground, power, or the like. The number of each of first and second pads 121 and 122 is not particularly limited, and may be plural. Each of the first and second pads 121 and 122 may include an electroplating layer (or electrolytic copper), but may not include an electroless plating layer (chemical copper) if necessary. For example, the number of metal layers of each of the first and second pads 121 and 122 may be smaller than the number of metal layers of each of the first to third wiring layers 141, 142 and 143.

Each of the first and second insulating walls 131 and 132 may include an insulating material. The insulating material may include a thermosetting resin such as an epoxy resin, a thermoplastic resin such as polyimide, or a material including an inorganic filler, an organic filler, and/or a glass fiber (or a glass cloth and/or a glass fabric) together with the thermosetting resin and the thermoplastic resin. The insulating material may be, for example, ABF, PPG, RCC, or the like, but is not limited thereto, and may also be other polymer materials. The number of each of first and second insulating walls 131 and 132 is not particularly limited, and may be plural. The first and second insulating walls 131 and 132 may include the same insulating material as the insulating layer 111, and the first and second insulating walls 131 and 132 and the insulating layer 111 may be an integrated single and identical component without boundary lines therebetween.

Each of the first to third wiring layers 141, 142, and 143 may include a metal material. The metal material may include copper (Cu), aluminum (Al), silver (Ag), tin (Sn), gold (Au), nickel (Ni), lead (Pb), titanium (Ti), or alloys thereof. The first to third wiring layers 141, 142, and 143 may perform various functions depending on designs of corresponding layers. For example, the first to third wiring layers 141, 142, and 143 may include ground patterns, power patterns, signal patterns, and the like. Here, the signal patterns may include various signals except for the ground patterns, the power patterns, and the like, such as data signals. Each of these patterns may include a line pattern, a plane pattern, and/or a pad pattern. The second wiring layer 142 formed on the second insulating layer 112, which is the build-up layer, may be a single layer as illustrated in FIG. 8, but may be a plurality of layers unlike FIG. 8, and the specific number of layers in the second wiring layer 142 is not particularly limited. Each of the first to third wiring layers 141, 142, and 143 may include an electroless plating layer (chemical copper) and an electroplating layer (or electrolytic copper).

Each of the first and second connection vias 151 and 152 may include a metal material. The metal material may include copper (Cu), aluminum (Al), silver (Ag), tin (Sn), gold (Au), nickel (Ni), lead (Pb), titanium (Ti), or alloys thereof. The first and second connection vias 151 and 152 may perform various functions depending on designs thereof. The first and second connection vias 151 and 152 may include connection vias for signal connection, connection vias for ground connection, connection vias for power connection, and the like. The first and second connection vias 151 and 152 may have shapes tapered in the same direction as connection vias of the first and second via layers 161 and 162. Each of the first and second connection vias 151 and 152 may be entirely filled with a metal material, or the metal material may be formed along a wall surface of each of via holes. The number of each of first and second connection vias 151 and 152 is not particularly limited, and may be plural. The first and second connection vias 151 and 152 may have a stack via relationship or a staggered via relationship with the connection vias of the first and second via layers 161 and 162, respectively. Each of the first and second connection vias 151 and 152 may include an electroless plating layer (chemical copper) and an electroplating layer (or electrolytic copper).

Each of the first and second via layers 161 and 162 may include a metal material. The metal material may include copper (Cu), aluminum (Al), silver (Ag), tin (Sn), gold (Au), nickel (Ni), lead (Pb), titanium (Ti), or alloys thereof. The first and second via layers 161 and 162 may perform various functions depending on designs of corresponding layers. The first and second via layers 161 and 162 may include connection vias for signal connection, connection vias for ground connection, connection vias for power connection, and the like. The first and second via layers 161 and 162 may include connection vias having shapes tapered in the same direction. For example, each of the connection vias of the first and second via layers 161 and 162 may have a tapered shape of which a width of an upper surface is narrower than a width of a lower surface in cross section. Each of the connection vias of the first and second via layers 161 and 162 may be completely filled with a metal material, or the metal material may be formed along a wall surface of each of via holes. The connection vias of the first and second via layers 161 and 162 may have a stack via relationship or a staggered via relationship with each other. The second via layer 162 formed in the second insulating layer 112, which is the build-up layer, may be a single layer as illustrated in FIG. 8, but may be a plurality of layers unlike FIG. 8, and the specific number of layers in the second via layer 162 is not particularly limited. Each of the first and second via layers 161 and 162 may include an electroless plating layer (chemical copper) and an electroplating layer (or electrolytic copper). The second via layer 162 may be formed by the same plating process as the third wiring layer 143 to be integrated with the third wiring layer 143 without a boundary line therebetween. The first via layer 161 may be formed by the same plating process as the second wiring layer 142 to be integrated with the second wiring layer 142 without a boundary line therebetween.

Each of the first and second passivation layers 171 and 172 may include a known solder resist layer. However, each of the first and second passivation layers 171 and 172 is not limited thereto, and may also include, for example, ABF including a thermosetting resin and an inorganic filler. The first and second passivation layers 171 and 172 may be disposed on the outermost sides of the printed circuit board 100E to protect patterns and the like inside the printed circuit board 100E from external impact. The first and second passivation layers 171 and 172 may have one or more first and second openings 171$h$ and 172$h$, respectively. For example, the first passivation layer 171 may have one or more first openings 171$h$ exposing at least portions of the surfaces of the second pads 122. In addition, the second passivation layer 172 may have one or more second openings 172$h$ exposing at least portions of the surface of the third wiring layer 143. Surface treatment layers including a nickel (Ni) layer and/or a gold (Au) layer may be formed on the surfaces exposed through the first and second openings 171$h$ and 172$h$.

Other contents, for example, the contents described in the above-described printed circuit boards 100A, 100B, 100C, and 100D may be applied to the printed circuit board 100E according to another exemplary embodiment as long as they are not contradictory, and a description of overlapping contents will be omitted.

FIGS. 9A to 9H are schematic cross-sectional views illustrating an example of processes of manufacturing the printed circuit board of FIG. 8.

Figure 9A:
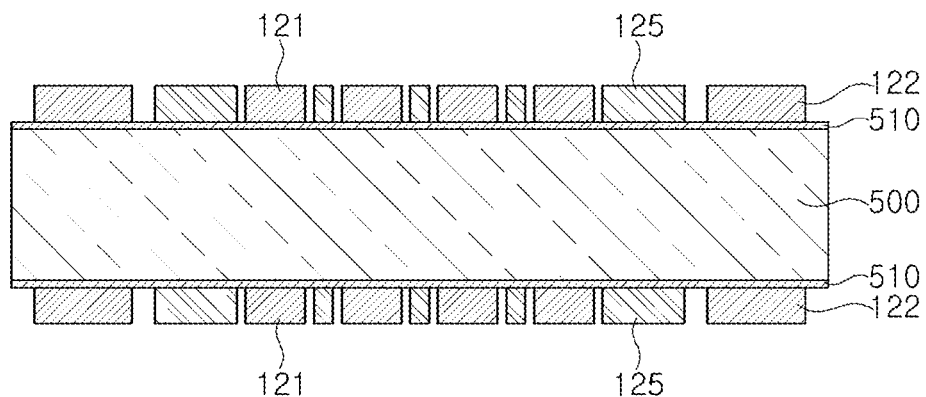
FIGS. 9A to 9H are schematic cross-sectional views illustrating an example of processes of manufacturing the printed circuit board of FIG. 8.

Referring to FIG. 9A, a carrier substrate 500 having metal layers 510 formed on one surface or both surfaces thereof may be prepared, and first and second pads 121 and 122 and conductive patterns 125 may be formed on the metal layers 510 of the carrier substrate 500. The carrier substrate 500 may be a copper clad laminate (CCL) or the like, but is not limited thereto. In addition, various carrier substrates that may be used as a detachment carrier may be used as the carrier substrate 500 without being particularly limited. The metal layer 510 may include a copper (Cu) layer such as copper foil, but is not limited thereto, and may further include another metal layer. A release layer for easy detachment may be disposed between the metal layer 510 and the carrier substrate 500. The first and second pads 121 and 122 and the conductive patterns 125 may be formed by a plating process such as an additive process (AP), a semi-AP (SAP), a modified SAP (MSAP), or tenting (TT) using the metal layer 510 as a seed layer.

Figure 9B:
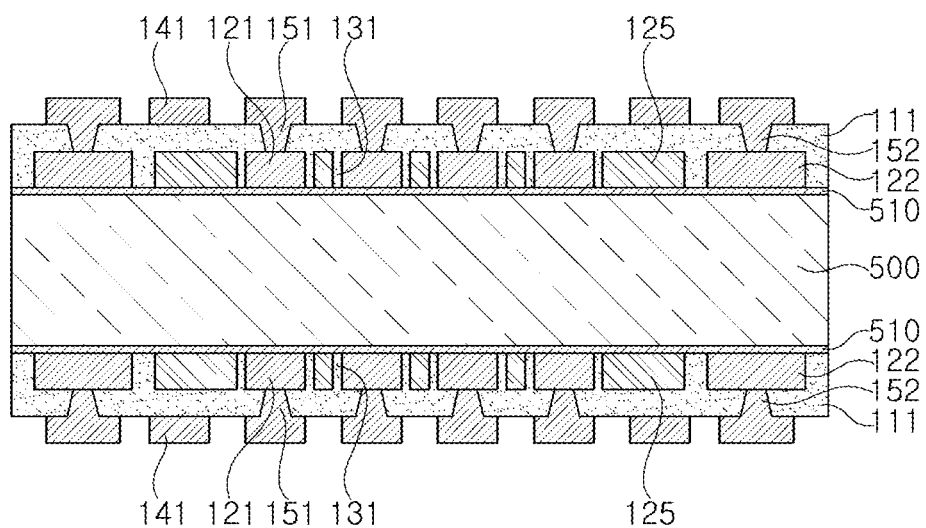

Referring to FIG. 9B, first insulating layers 111 embedding at least portions of each of the first and second pads 121 and 122 and the conductive patterns 125 therein may be formed on the metal layers 510 of the carrier substrate 500. The first insulating layer 111 may be formed by laminating an unhardened layer including the above-described insulating material and then hardening the unhardened layer. Alternatively, the first insulating layer 111 may be formed by applying the above-described insulating material and then hardening the insulating material. The insulating material may fill gaps between adjacent patterns among the first and second pads 121 and 122 and the conductive patterns 125 and cover the first and second pads 121 and 122 and the conductive patterns 125. Thereafter, via holes may be formed in the first insulating layers 111 using a laser drill or the like, and a plating process such as an AP, an SAP, an MSAP, or TT may be performed on the first insulating layers 111 to form first wiring layers 141 and first and second connection vias 151 and 152.

Figure 9C:
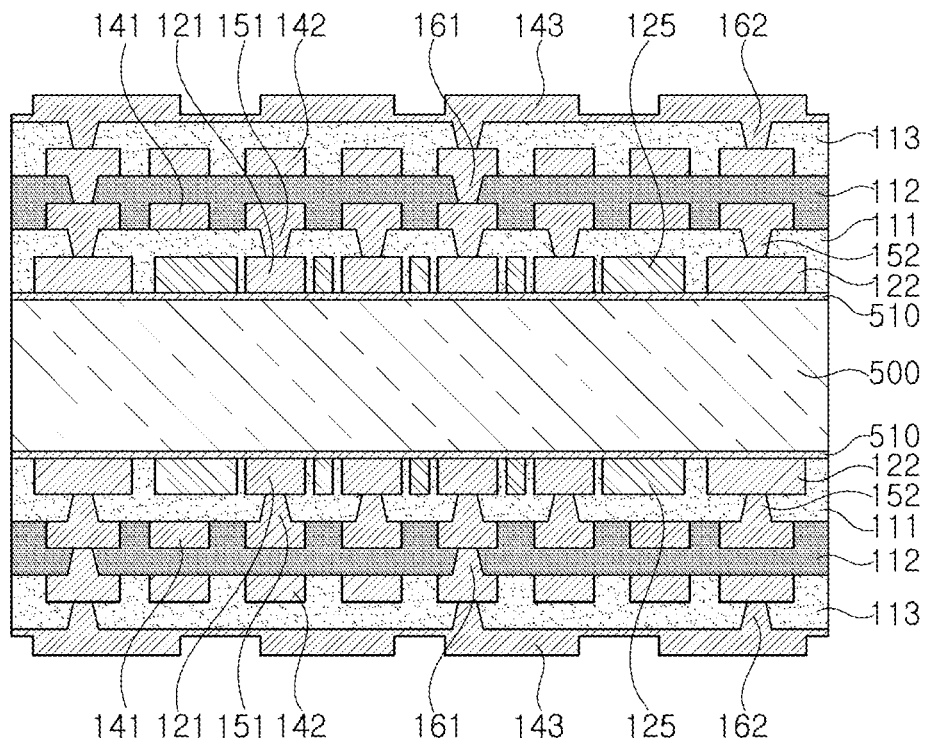

Referring to FIG. 9C, second insulating layers 112 embedding at least portions of the first wiring layers 141 therein may be formed on the first insulating layers 111. The second insulating layer 112 may be formed by laminating an unhardened layer including the above-described insulating material and then hardening the unhardened layer. Alternatively, the second insulating layer 112 may be formed by applying the above-described insulating material and then hardening the insulating material. Thereafter, via holes may be formed in the second insulating layers 112 using a laser drill or the like, and a plating process such as an AP, an SAP, an MSAP, or TT may be performed on the second insulating layers 112 to form second wiring layers 142 and first via layers 161. Thereafter, third insulating layers 113 embedding at least portions of the second wiring layers 142 therein may be formed on the second insulating layers 112. The third insulating layer 113 may be formed by laminating an unhardened layer including the above-described insulating material and then hardening the unhardened layer. Alternatively, the third insulating layer 113 may be formed by applying the above-described insulating material and then hardening the insulating material. Thereafter, via holes may be formed in the third insulating layers 113 using a laser drill or the like, and a plating process such as an AP, an SAP, an MSAP, or TT may be performed on the third insulating layers 113 to form third wiring layers 143 and second via layers 162.

Figure 9D:
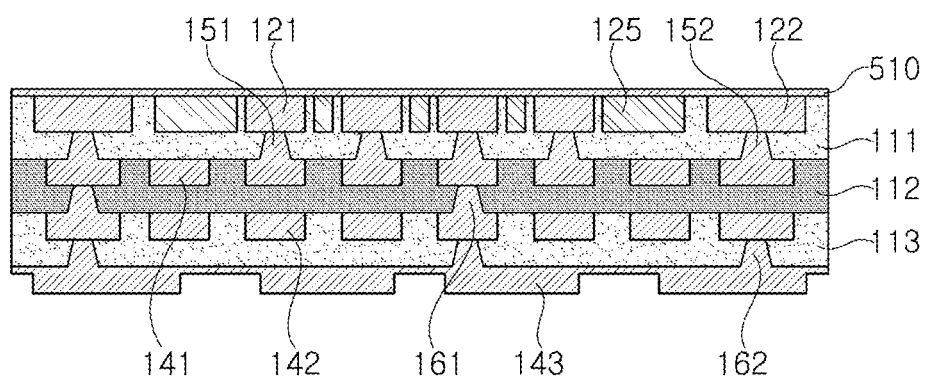

Referring to FIG. 9D, the carrier substrate 500 may be removed. For example, the carrier substrate 500 and the metal layer 510 may be separated from each other. The release layer may be used to separate the carrier substrate 500 and the metal layer 510 from, but is not limited thereto.

Figure 9E:
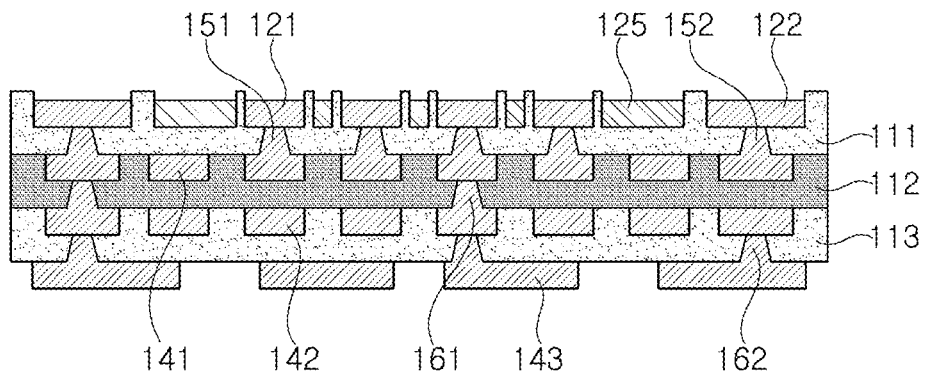

Referring to FIG. 9E, the metal layer 510 may be removed. The metal layer 510 may be removed using, for example, a seed etching process. In this case, a seed layer of the third wiring layer 143 may also be removed together with the metal layer 510. In a process of removing the metal layer 510, surfaces of the first and second pads 121 and 122 may also be partially removed by etching, and resultantly, each of the surfaces of the first and second pads 121 and 122 may have a step portion from a surface of the first insulating layer 111.

However, if necessary, the metal layer 510 may include a copper (Cu) layer and a barrier layer including a metal having an etching property different from that of the copper layer, such as nickel (Ni) or titanium (Ti). In this case, when the metal layer 510 is etched, the barrier layer may be etched after the copper (Cu) layer is etched. As a result, when the copper (Cu) layer is etched, the barrier layer may protect the first and second pads 121 and 122, and thus, the surfaces of the first and second pads 121 and 122 may be substantially unaffected by the etching. Therefore, the step portion may not be substantially generated.

Figure 9F:
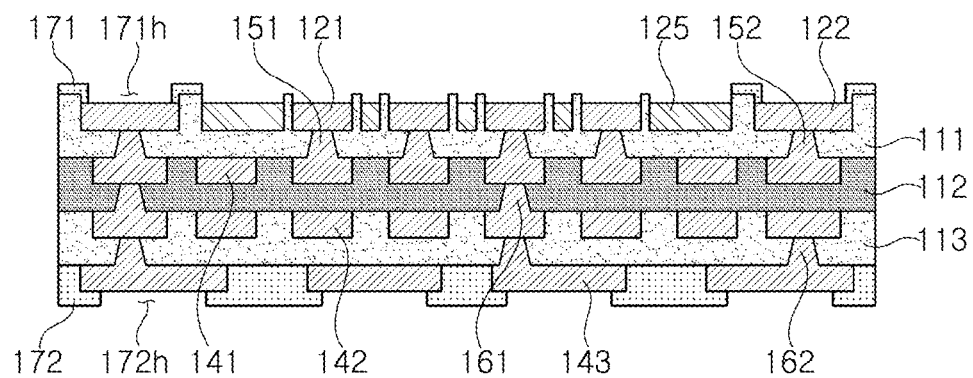

Referring to FIG. 9F, first and second passivation layers 171 and 172 may be formed. First and second openings 171h and 172h may be formed by patterning the first and second passivation layers 171 and 172. The first and second passivation layers 171 and 172 may be formed by, for example, a method of forming solder resist layers and then performing patterning using a photolithography process or the like so as to have the first and second openings 171h and 172h, respectively, but are not limited thereto.

Figure 9G:
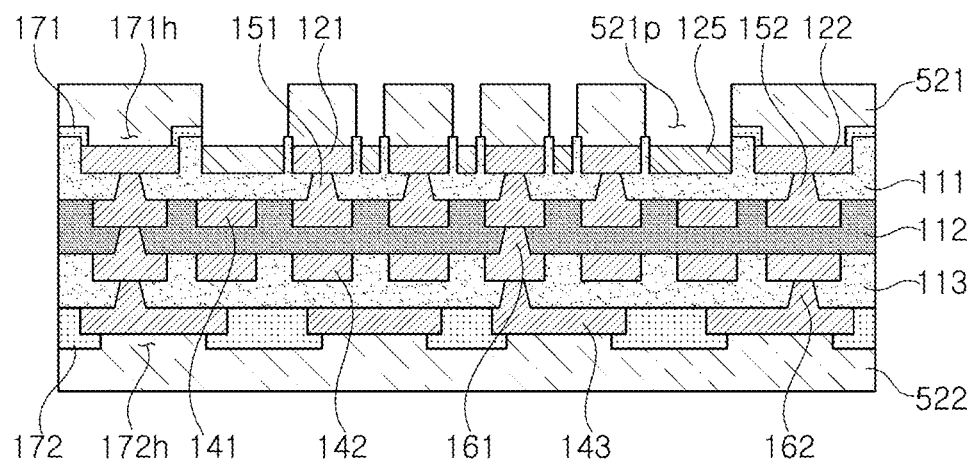

Referring to FIG. 9G, a first dry film 521 may be disposed on the first insulating layer 111 and the first passivation layer 171. In addition, a second dry film 522 may be disposed on the second passivation layer 172. Thereafter, exposing parts 521p exposing the conductive patterns 125 may be formed by patterning the first dry film 521 by a photolithography process such as exposure and development.

Figure 9H:
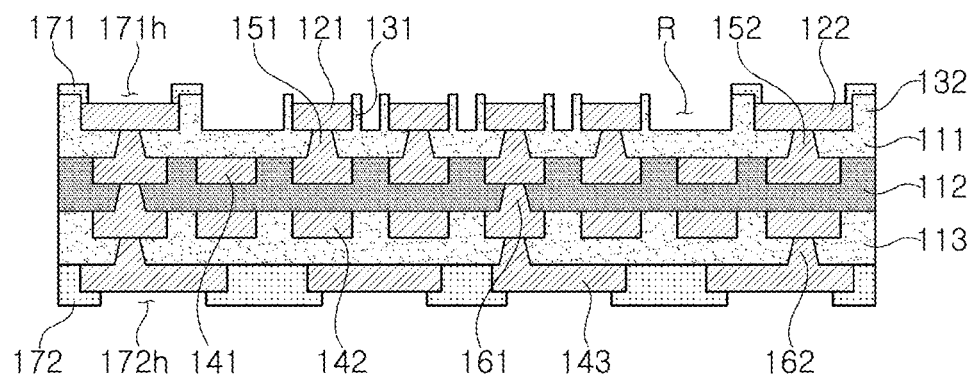

Referring to FIG. 9H, the conductive patterns 125 may be removed. For example, the conductive patterns 125 selectively exposed through the exposing parts 521p may be removed by an etching process. When the conductive patterns 125 are removed, a recess R may be formed. First and second insulating walls 131 and 132 covering side surfaces of the first and second pads 121 and 122 may be formed on the first insulating layer 111 by the recess R. Thereafter, the first and second dry films 521 and 522 may be removed. In this case, for example, a known stripper may be used.

If necessary, a surface treatment layer may be further formed on the first and second pads 121 and 122. The surface treatment layer may be formed by, for example, electrolytic gold plating, electroless gold plating, OSP or electroless tin plating, electroless silver plating, electroless nickel plating/substituted gold plating, DIG plating, HASL, or the like. The surface treatment layer may include at least one of a nickel (Ni) layer and a gold (Au) layer, but is not limited thereto.

The printed circuit board 100E according to another exemplary embodiment described above may be manufactured through the series of processes described above, but this is only one manufacturing example, and the printed circuit board 100E according to another exemplary embodiment described above may also be manufactured by processes different from the processes described above.

Other contents, for example, the contents described in the above-described printed circuit boards 100A, 100B, 100C, 100D, and 100E may be applied to processes of manufacturing the printed circuit board of FIG. 8 as long as they are not contradictory, and a description of overlapping contents will be omitted.

Figure 10:
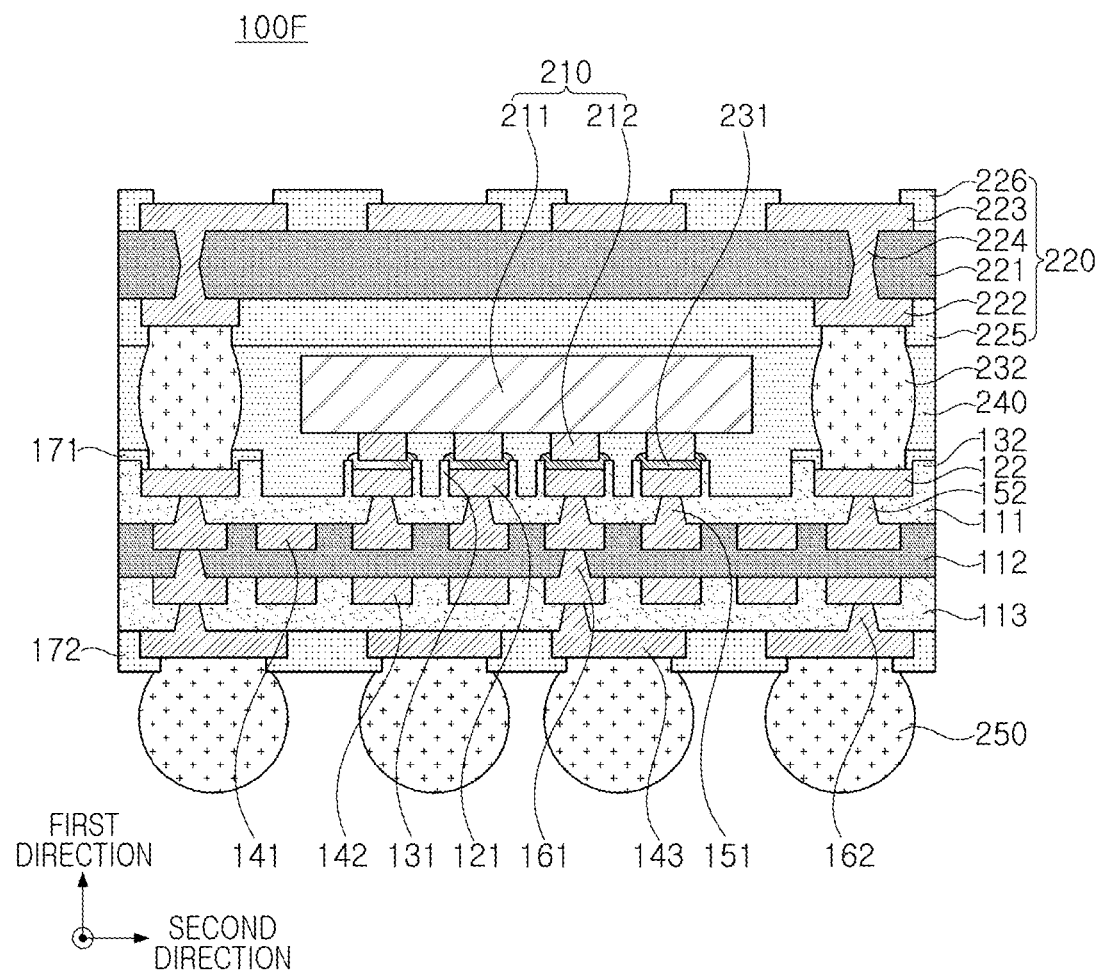
FIG. 10 is a schematic cross-sectional view illustrating a modified example of the printed circuit board of FIG. 8.

FIG. 10 is a schematic cross-sectional view illustrating a modified example of the printed circuit board of FIG. 8.

Referring to FIG. 10, a printed circuit board 100F according to a modified example may have a package structure in which an electronic component 210 is surface-mounted and disposed on the above-described printed circuit board 100E and a separate wiring board 220 is then disposed on the electronic component 210 in a board-on-board form. For example, the printed circuit board 100F according to a modified example may be different from the above-described printed circuit board 100E in that it further includes the electronic component 210 disposed on the first insulating layer 111 and including connection terminals 212 electrically connected to the first pads 121 through first connection members 231 and the wiring board 220 disposed on the electronic component 210 and including connection pads 222 electrically connected to the second pads 122 through second connection members 232. The printed circuit board 100F according to a modified example may further include a molding material 240 molding a space between the first insulating layer 111 and the wiring board 220 and/or electrical connection metal 250 connected to the third wiring layer 143, if necessary. The above-described printed circuit board 100E may be used as a package substrate on which a flip-chip die or the like is to be mounted.

The electronic components 210 may be various types of active components and/or passive components. For example, the electronic component 210 may include various types of integrated circuit (IC) dies 211 such as a flip-chip die. Alternatively, the electronic component 210 may include a chip-type passive component such as a chip capacitor such as a multilayer ceramic capacitor (MLCC) or a chip inductor such as a power inductor (PI). Alternatively, the electronic component 210 may include a silicon capacitor. As such, a type of the electronic component 210 is not particularly limited. The electronic component 210 may include the connection terminals 212 including a metal material such as copper (Cu) or aluminum (Al). The electronic component 210 may be surface-mounted in a face-down form through the connection terminals 212. The electronic component 210 may have a front surface on which the connection terminals 212 are disposed and a back surface on which the connection terminals 212 are not disposed.

The wiring board 220 may be an interposer substrate for connection with another package or a package substrate on which another semiconductor die or the like is to be directly mounted. The wiring board 220 may include an insulating layer 221, connection pads 222 and 223 disposed on both sides of the insulating layer 221, through vias 224 penetrating through the insulating layer 221 and electrically connecting the connection pads 222 and 223 to each other, and passivation layers 225 and 226 disposed on both sides of the insulating layer 221 and covering at least portions of the connection pads 222 and 223. However, this is only an example, and insulating layers, wiring layers, and via layers constituting the wiring board 220 may also be further disposed in various forms.

The insulating layer 221 may include an insulating material. The insulating material may include a thermosetting resin such as an epoxy resin, a thermoplastic resin such as polyimide, or a material including an inorganic filler, an organic filler, and/or a glass fiber (or a glass cloth and/or a glass fabric) together with the thermosetting resin and the thermoplastic resin. The insulating material may be, for example, ABF, PPG, RCC, or the like, but is not limited thereto, and may also be other polymer materials.

Each of the connection pads 222 and 223 may include a metal material. The metal material may include copper (Cu), aluminum (Al), silver (Ag), tin (Sn), gold (Au), nickel (Ni), lead (Pb), titanium (Ti), or alloys thereof. The connection pads 222 and 223 may perform various functions depending on their designs. For example, the connection pads 222 and 223 may include ground pads, power pads, signal pads, and the like. Here, the signal pads may include pads for connection of various signals such as data signals except for ground, power, or the like. The number of each of connection pads 222 and 223 is not particularly limited, and may be plural.

Each of the through vias 224 may include a metal material. The metal material may include copper (Cu), aluminum (Al), silver (Ag), tin (Sn), gold (Au), nickel (Ni), lead (Pb), titanium (Ti), or alloys thereof. The through vias 224 may perform various functions depending on their designs. The through vias 224 may include through vias for signal connection, through vias for ground connection, through vias for power connection, and the like. Each of the through vias 224 may have various shapes such as an hourglass shape and a cylindrical shape.

Each of the passivation layers 225 and 226 may include a known solder resist layer. However, each of the passivation layers 225 and 226 is not limited thereto, and may include, for example, ABF, including a thermosetting resin and an inorganic filler. Each of the passivation layers 225 and 226 may have one or more openings. A surface treatment layer including a nickel (Ni) layer and/or a gold (Au) layer may be formed on surfaces of the connection pads 222 and 223 exposed through these openings.

Each of the first and second connection members 231 and 232 may include a low melting metal having a lower melting point than copper (Cu), such as tin (Sn) or alloys including tin (Sn). For example, each of the first and second connection members 231 and 232 may include a solder. For example, each of the first and second connection members 231 and 232 may have a solder ball joint shape. The numbers, intervals, disposition forms, and the like, of first and second connection members 231 and 232 are not particularly limited.

The molding material 240 may mold the electronic component 210, the first and second connection members 231 and 232, and the like, to protect the electronic component 210, the first and second connection members 231 and 232, and the like. The molding material 240 may include an epoxy resin or the like, but is not particularly limited thereto, and may include other known materials.

The electrical connection metals 250 may physically or electrically externally connect the printed circuit board 100F For example, the printed circuit board 100F may be a ball grid array (BGA)-type package board. Each of the electrical connection metals 250 may include a low melting metal having a lower melting point than copper (Cu), such as tin (Sn) or alloys including tin (Sn). For example, each of the electrical connection metals 250 may include a solder, but this is only an example, and a material of each of the electrical connection metals 250 is not particularly limited thereto. Each of the electrical connection metals 250 may be a land, a ball, a pin, or the like. The electrical connection metals 250 may be formed as a multilayer or single layer structure. When the electrical connection metals 250 formed as a multilayer structure, the electrical connection metals 250 may include a copper (Cu) pillar and a solder. When the electrical connection metals 250 are formed as a single layer structure, the electrical connection metals 250 may include a tin-silver solder or copper (Cu). However, this is only an example, and the electrical connection metals 250 are not limited thereto. The number, an interval, a disposition form, and the like, of electrical connection metals 250 are not particularly limited, but may be sufficiently modified depending on design particulars.

Other contents, for example, the contents described in the above-described printed circuit boards 100A, 100B, 100C, 100D, and 100E may be applied to the printed circuit board 100F according to a modified example as long as they are not contradictory, and a description of overlapping contents will be omitted.

Figure 11:
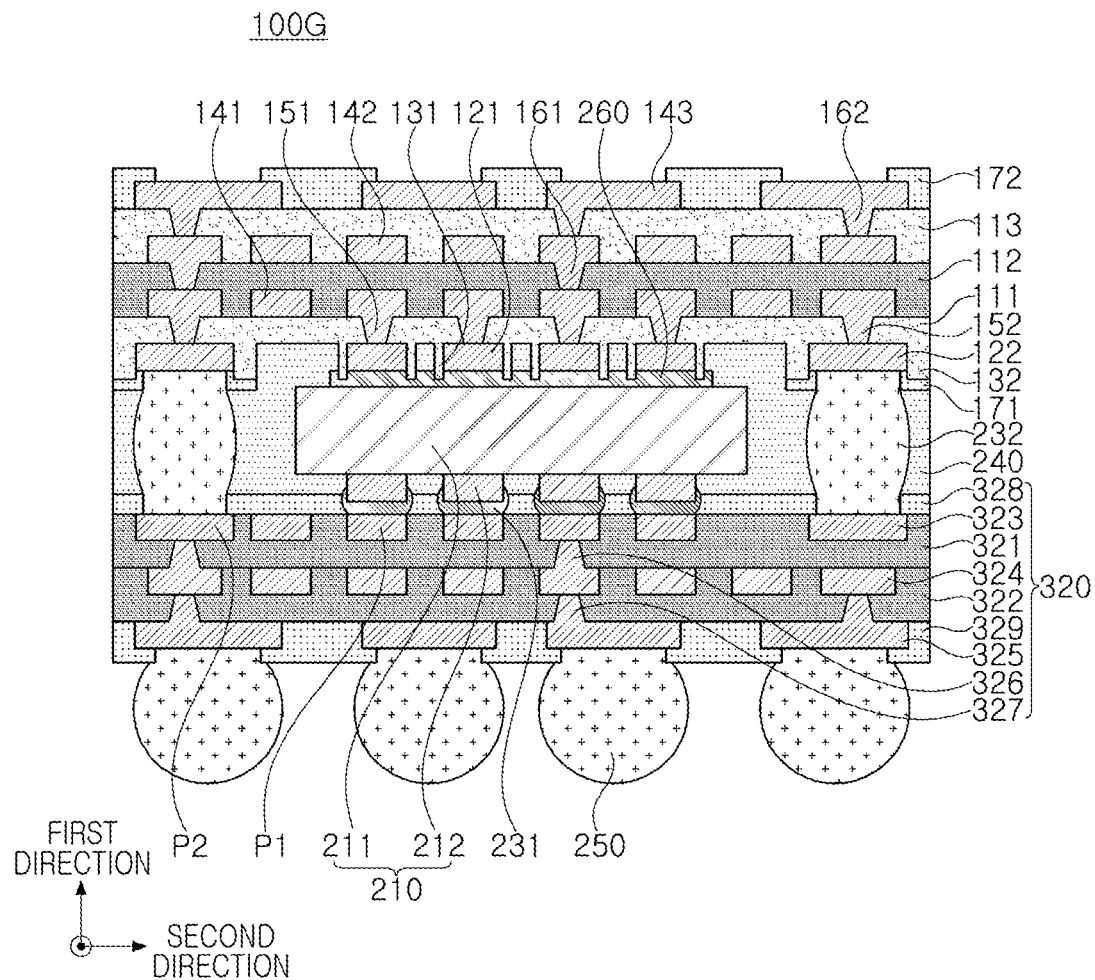
FIG. 11 is a schematic cross-sectional view illustrating another modified example of the printed circuit board of FIG. 8.

FIG. 11 is a schematic cross-sectional view illustrating another modified example of the printed circuit board of FIG. 8.

Referring to FIG. 11, a printed circuit board 100G according to another modified example may have a package structure in which an electronic component 210 is surface-mounted and disposed on a separate wiring board 320 and the above-described printed circuit board 100E is then disposed on the electronic component 210 in a board-on-board form. For example, the printed circuit board 100G according to another modified example may be different from the above-described printed circuit board 100E in that it further includes the wiring board 320 disposed on the first insulating layer 111 and including connection pads P1 and P2 disposed in a center region and a side region thereof and the electronic component 210 disposed between the first insulating layer 111 and the wiring board 320 and having a front surface on which connection terminals 212 are disposed and a back surface opposing the front surface. The connection pads P1 and P2 of the wiring board 320 may be electrically connected to the connection terminals 212 of the electronic component 210 and the second pads 122 through first and second connection members 231 and 232, respectively. The printed circuit board 100G according to another modified example may further include a molding material 240 molding a space between the first insulating layer 111 and the wiring board 320 and/or electrical connection metal 250 connected to the wiring layer 325, if necessary. In addition, the printed circuit board 100G according to another modified example may further include conductive members 260 connecting the first pads 121 and the back surface of the electronic component 210 to each other. The above-described printed circuit board 100E may be used as an upper substrate having a heat dissipation function. Here, the upper board may be an interposer substrate for connection with another package or a package substrate on which another semiconductor die or the like is to be directly mounted.

The wiring board 320 may be a package board on which the electronic component 210 is to be mounted. The wiring board 320 may include a plurality of insulating layers 321 and 322, a plurality of wiring layers 323, 324, and 325, a plurality of via layers 326 and 327, and a plurality of passivation layers 328 and 329. The plurality of insulating layers 321 and 322, the plurality of wiring layers 323, 324, and 325, and the plurality of via layers 326 and 327 constituting the wiring board 320 may be disposed in various forms. For example, the wiring board 320 may have a form of a substrate having a core or have a form of a coreless substrate.

Each of the insulating layers 321 and 322 may include an insulating material. The insulating material may include a thermosetting resin such as an epoxy resin, a thermoplastic resin such as polyimide, or a material including an inorganic filler, an organic filler, and/or a glass fiber (or a glass cloth and/or a glass fabric) together with the thermosetting resin and the thermoplastic resin. The insulating material may be, for example, ABF, PPG, RCC, or the like, but is not limited thereto, and may also be other polymer materials.

Each of the wiring layers 323, 324, and 325 may include a metal material. The metal material may include copper (Cu), aluminum (Al), silver (Ag), tin (Sn), gold (Au), nickel (Ni), lead (Pb), titanium (Ti), or alloys thereof. The wiring layers 323, 324, and 325 may perform various functions depending on their designs. For example, the wiring layers 323, 324, and 325 may include ground patterns, power patterns, signal patterns, and the like. Here, the signal patterns may include various signals except for the ground patterns, the power patterns, and the like, such as data signals. Each of these patterns may include a line pattern, a plane pattern, and/or a pad pattern. The number of each of connection pads P1 and P2 is not particularly limited, and may be plural.

Each of the via layers 326 and 327 may include a metal material. The metal material may include copper (Cu), aluminum (Al), silver (Ag), tin (Sn), gold (Au), nickel (Ni), lead (Pb), titanium (Ti), or alloys thereof. The via layers 326 and 327 may perform various functions depending on designs of corresponding layers. The via layers 326 and 327 may include connection vias for signal connection, connection vias for ground connection, connection vias for power connection, and the like. The via layers 326 and 327 may include connection vias having shapes tapered in the same direction. Each of the connection vias of the via layers 326 and 327 may be completely filled with a metal material, or the metal material may be formed along a wall surface of each of via holes. The connection vias of the via layers 326 and 327 may have a stack via relationship or a staggered via relationship with each other.

Each of the passivation layers 328 and 329 may include a known solder resist layer. However, each of the passivation layers 328 and 329 is not limited thereto, and may include, for example, ABF, including a thermosetting resin and an inorganic filler. Each of the passivation layers 328 and 329 may have one or more openings. A surface treatment layer including a nickel (Ni) layer and/or a gold (Au) layer may be formed on at least portions of surfaces of the outermost wiring layers 323 and 325 exposed through these openings.

The conductive members 260 may effectively transfer heat generated from the back surface of the electronic component 210 to an upper board. The conductive members 260 may include various types of thermally conductive pastes and/or thermally conductive resins, and specific materials of the conductive members 260 are not particularly limited.

Other contents, for example, the contents described in the above-described printed circuit boards 100A, 100B, 100C, 100D, 100E, and 100F may be applied to the printed circuit board 100G according to another modified example as long as they are not contradictory, and a description of overlapping contents will be omitted.

Figure 12:
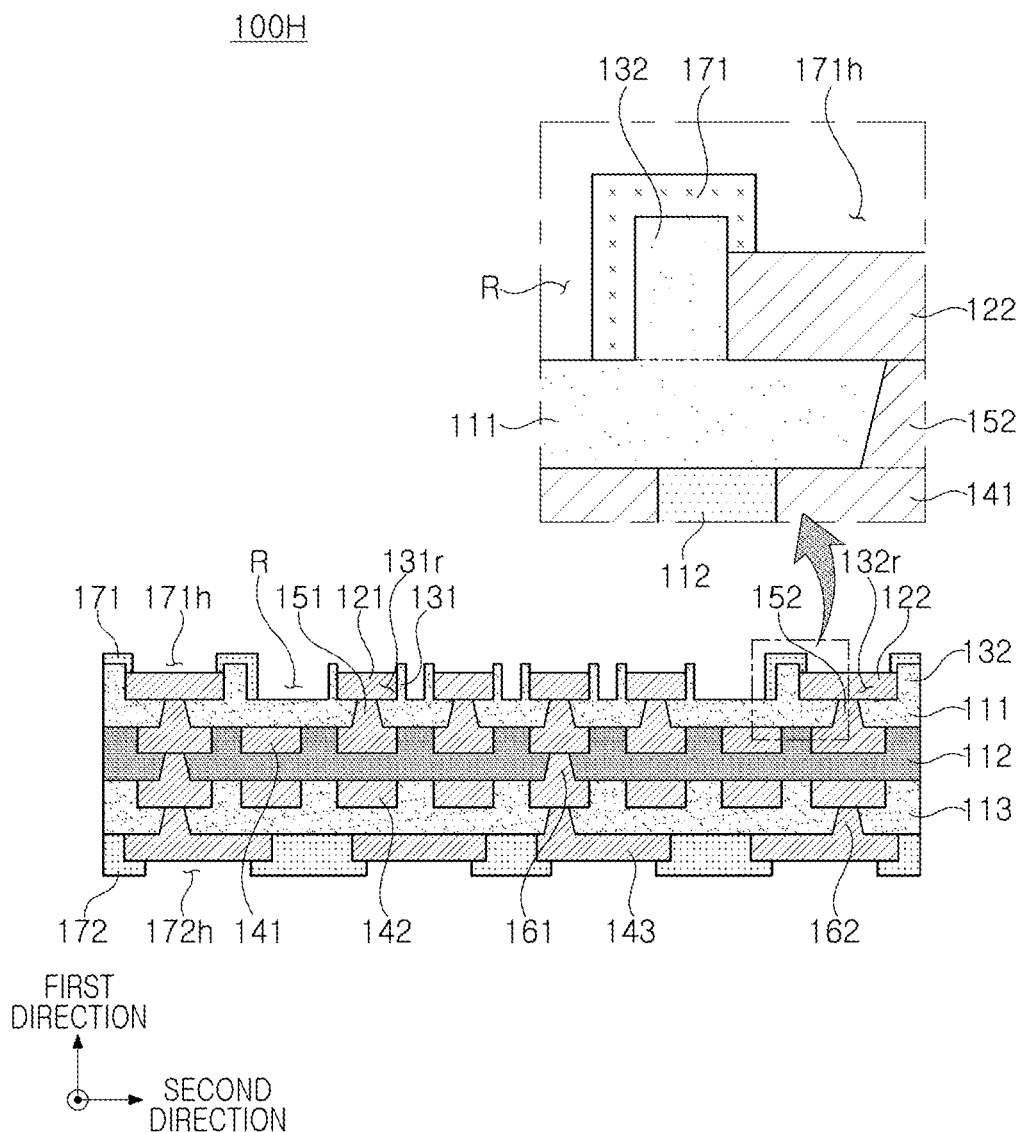
FIG. 12 is a schematic cross-sectional view illustrating another example of a printed circuit board.

FIG. 12 is a schematic cross-sectional view illustrating another example of a printed circuit board.

Referring to FIG. 12, a printed circuit board 100H according to another exemplary embodiment may include a first insulating layer 111, first pads 121 and second pads 122 disposed on an upper surface of the first insulating layer 111, first insulating walls 131 disposed on the upper surface of the first insulating layer 111 and covering side surfaces of the first pads 121, and second insulating walls 132 disposed on the upper surface of the first insulating layer 111 and covering side surfaces of the second pads 122.

The printed circuit board 100H according to another exemplary embodiment may further include a first wiring layer 141 disposed on a lower surface of the first insulating layer 111, first connection vias 151 penetrating through the first insulating layer 111 and electrically connecting the first pads 121 to at least portions of the first wiring layer 141, and/or second connection vias 152 penetrating through the first insulating layer 111 and electrically connecting the second pads 122 to at least other portions of the first wiring layer 141, if necessary.

The printed circuit board 100H according to another exemplary embodiment may further include a second insulating layer 112 disposed on the lower surface of the first insulating layer 111 and embedding at least portions of the first wiring layer 141 therein, a second wiring layer 142 disposed on a lower surface of the second insulating layer 112, and/or a first via layer 161 penetrating through the second insulating layer 112 and electrically connecting at least portions of each of the first wiring layer 141 and the second wiring layer 142 to each other, if necessary.

The printed circuit board 100H according to another exemplary embodiment may further include a third insulating layer 113 disposed on the lower surface of the second insulating layer 112 and embedding at least portions of the second wiring layer 142 therein, a third wiring layer 143 disposed on a lower surface of the third insulating layer 113, and/or a second via layer 162 penetrating through the third insulating layer 113 and electrically connecting at least portions of each of the second wiring layer 142 and the third wiring layer 143 to each other, if necessary.

The printed circuit board 100H according to another exemplary embodiment may further include a first passivation layer 171 disposed on the second insulating walls 132 and having first openings 171h exposing at least portion of surfaces of the second pads 122 and/or a second passivation layer 172 disposed on the lower surface of the third insulating layer 113 and having second openings 172h exposing at least portions of a surface of the third wiring layer 143, if necessary.

Meanwhile, in the printed circuit board 100H according to another exemplary embodiment, a recess R may exist between the first insulating walls 131 and/or between the first insulating wall 131 and the second insulating wall 132, and at least portions of the first passivation layer 171 may extend to at least portions of the recess R. For example, the first passivation layer 171 may cover at least portions of wall surfaces and at least portions of a bottom surface of the recess R. For example, the first passivation layer 171 may extend from an upper surface of the second insulating wall 132 to cover a side surface of the second insulating wall 132 so that the first passivation layer 171 may be in contact with the first insulating layer 111. Therefore, close adhesion of the first passivation layer 171 may be further secured, and reliability may be further improved.

Other contents, for example, the contents described in the above-described printed circuit boards 100A, 100B, 100C, 100D, 100E, 100F, and 100G may be applied to the printed circuit board 100H according to another exemplary embodiment as long as they are not contradictory, and a description of overlapping contents will be omitted.

FIGS. 13A to 13H are schematic cross-sectional views illustrating an example of processes of manufacturing the printed circuit board of FIG. 12.

Figure 13A:
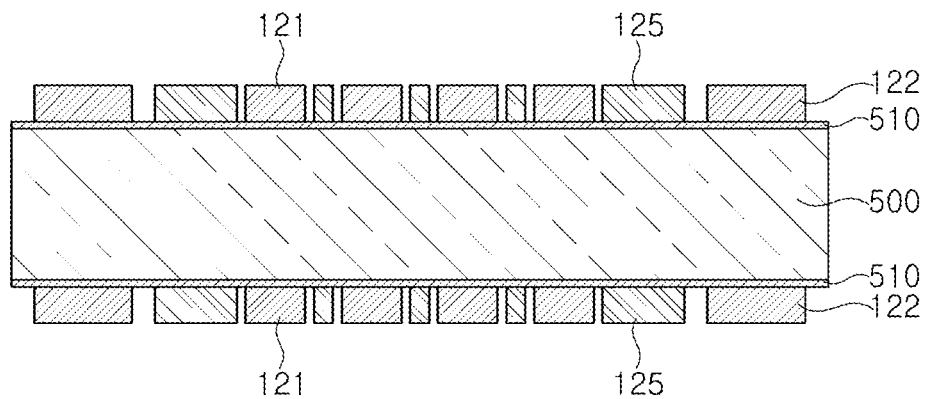
FIGS. 13A to 13H are schematic cross-sectional views illustrating an example of processes of manufacturing the printed circuit board of FIG. 12.

Referring to FIG. 13A, a carrier substrate 500 having metal layers 510 formed on one surface or both surfaces thereof may be prepared, and first and second pads 121 and 122 and conductive patterns 125 may be formed on the metal layers 510 of the carrier substrate 500.

Figure 13B:
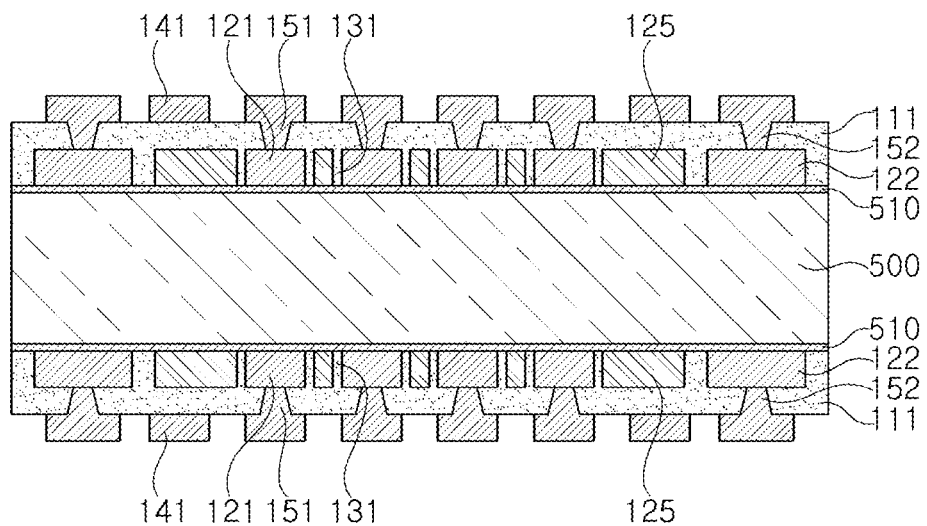

Referring to FIG. 13B, first insulating layers 111 embedding at least portions of each of the first and second pads 121 and 122 and the conductive patterns 125 therein may be formed on the metal layers 510 of the carrier substrate 500. Thereafter, first wiring layers 141 and first and second connection vias 151 and 152 may be formed.

Figure 13C:
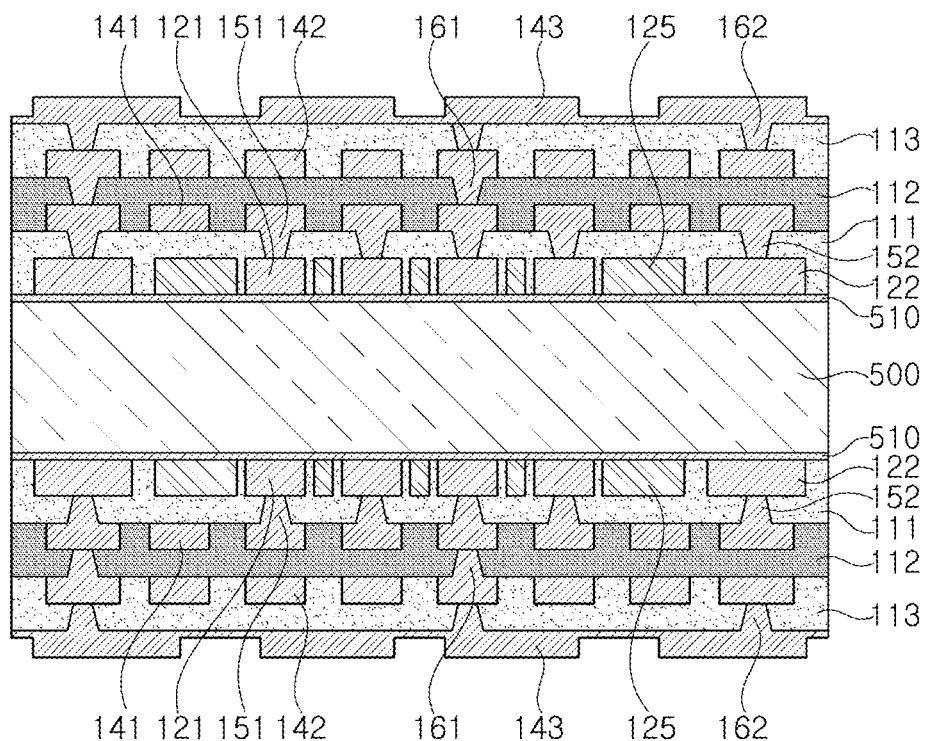

Referring to FIG. 13C, second insulating layers 112 embedding at least portions of the first wiring layers 141 therein may be formed on the first insulating layers 111. Thereafter, second wiring layers 142 and first via layers 161 may be formed. Thereafter, third insulating layers 113 embedding at least portions of the second wiring layers 142 therein may be formed on the second insulating layers 112. Thereafter, third wiring layers 143 and second via layers 162 may be formed.

Figure 13D:
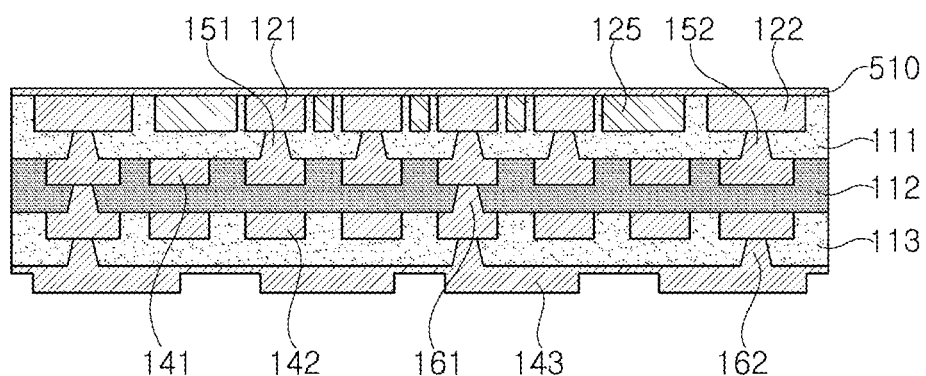

Referring to FIG. 13D, the carrier substrate 500 may be removed. For example, the carrier substrate 500 and the metal layer 510 may be separated from each other.

Figure 13E:
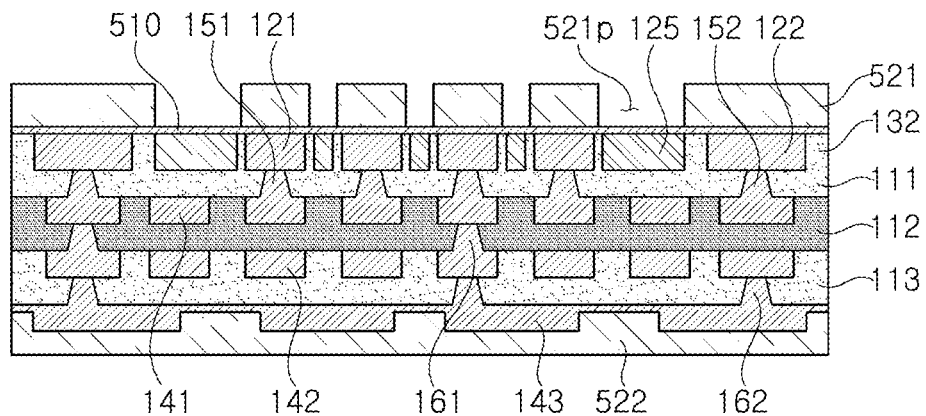

Referring to FIG. 13E, a first dry film 521 may be disposed on the metal layer 510. In addition, a second dry film 522 may be disposed on the third insulating layer 113. Thereafter, exposing parts 521p exposing the metal layer 510 disposed on the conductive patterns 125 may be formed by patterning the first dry film 521 by a photolithography process such as exposure and development.

Figure 13F:
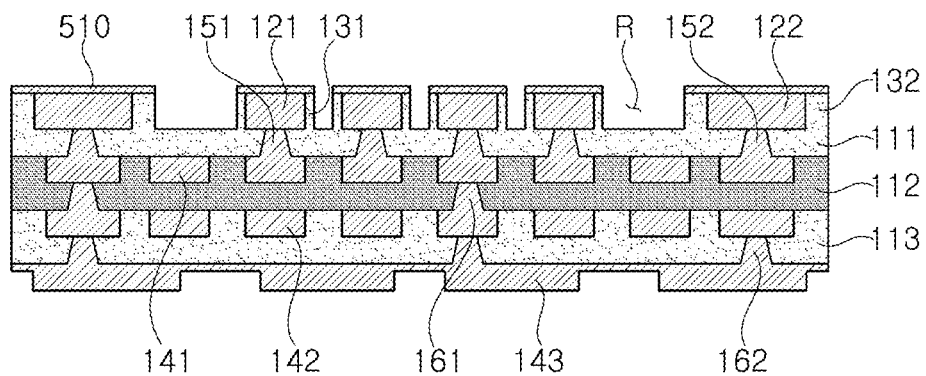

Referring to FIG. 13F, the conductive patterns 125 may be removed. For example, the conductive patterns 125 and the metal layer 510 selectively exposed through the exposing parts 521p may be removed by an etching process. When the conductive patterns 125 are removed, a recess R may be formed. First and second insulating walls 131 and 132 covering side surfaces of the first and second pads 121 and 122 may be formed on the first insulating layer 111 by the recess R. Thereafter, the first and second dry films 521 and 522 may be removed.

Figure 13G:
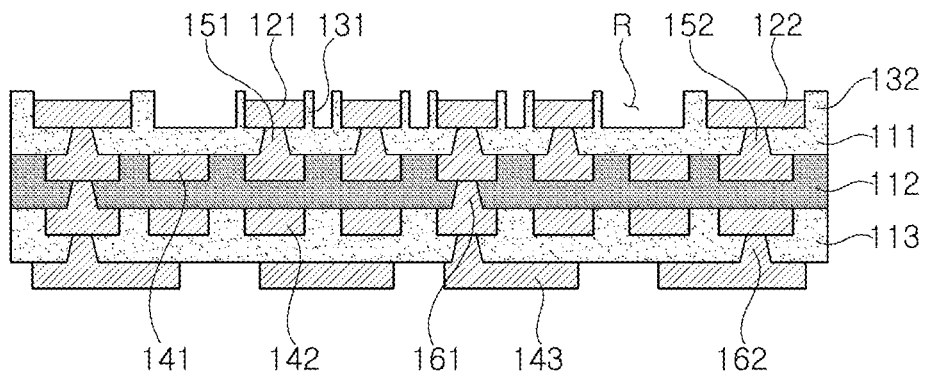

Referring to FIG. 13G, the metal layer 510 may be removed. The metal layer 510 may be removed using, for example, a seed etching process. In this case, a seed layer of the third wiring layer 143 may also be removed together with the metal layer 510.

Figure 13H:
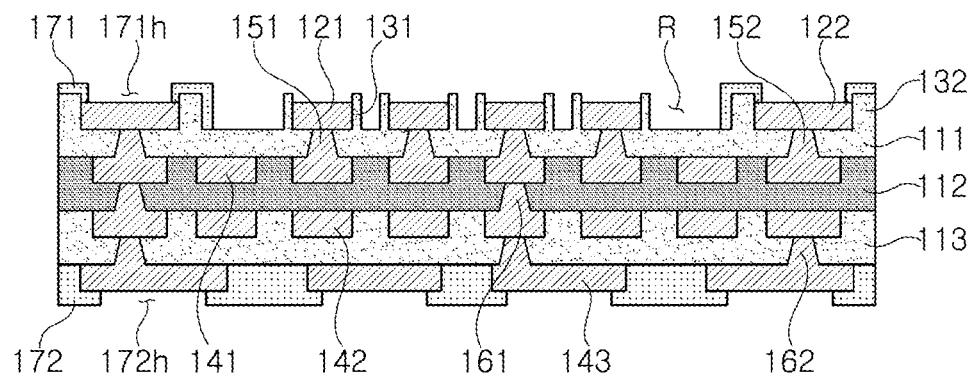

Referring to FIG. 13H, first and second passivation layers 171 and 172 may be formed. At least portions of the first passivation layer 171 may also be formed in at least portions of a region from which the conductive patterns 125 are removed, that is, the recess R. First and second openings 171h and 172h may be formed by patterning the first and second passivation layers 171 and 172.

The printed circuit board 100H according to another exemplary embodiment described above may be manufactured through the series of processes described above, but this is only one manufacturing example, and the printed circuit board 100H according to another exemplary embodiment described above may also be manufactured by processes different from the processes described above.

Other contents, for example, the contents described in the above-described printed circuit boards 100A, 100B, 100C, 100D, 100E, 100F, 100F, and 100H and the contents described in the example of the processes of manufacturing the printed circuit board described above may be applied to the processes of manufacturing the printed circuit board of FIG. 12 as long as they are not contradictory, and a description of overlapping contents will be omitted.

Figure 14:
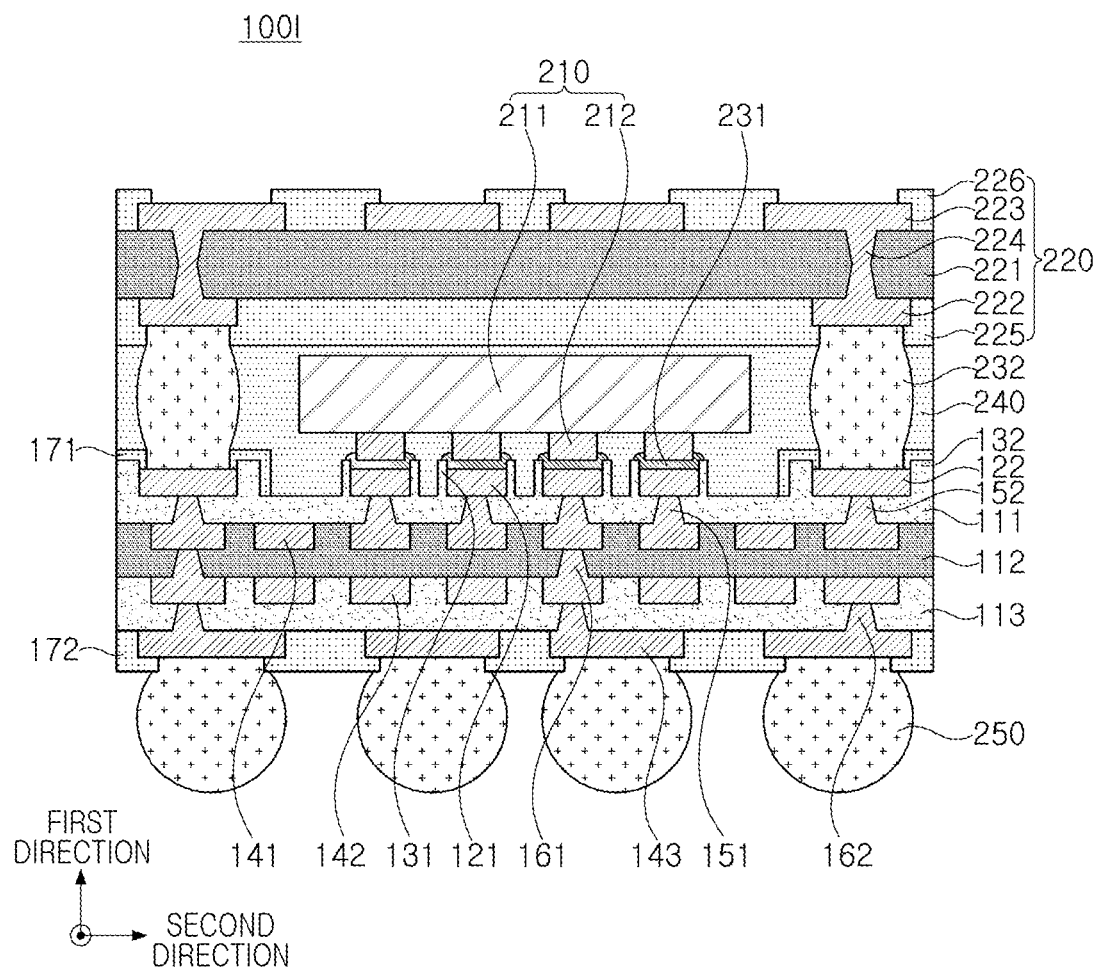
FIG. 14 is a schematic cross-sectional view illustrating a modified example of the printed circuit board of FIG. 12.

FIG. 14 is a schematic cross-sectional view illustrating a modified example of the printed circuit board of FIG. 12.

Referring to FIG. 14, a printed circuit board 100I according to a modified example may have a package structure in which an electronic component 210 is surface-mounted and disposed on the above-described printed circuit board 100H and a separate wiring board 220 is then disposed on the electronic component 210 in a board-on-board form. For example, the printed circuit board 100I according to a modified example may be different from the above-described printed circuit board 100H in that it further includes the electronic component 210 disposed on the first insulating layer 111 and including connection terminals 212 electrically connected to the first pads 121 through first connection members 231 and the wiring board 220 disposed on the electronic component 210 and including connection pads 222 electrically connected to the second pads 122 through second connection members 232. The printed circuit board 100I according to a modified example may further include a molding material 240 molding a space between the first insulating layer 111 and the wiring board 220 and/or electrical connection metal 250 connected to the third wiring layer 143, if necessary. The above-described printed circuit board 100H may be used as a package substrate on which a flip-chip die or the like is to be mounted.

Other contents, for example, the contents described in the above-described printed circuit boards 100A, 100B, 100C, 100D, 100E, 100F, 100G, and 100H may be applied to the printed circuit board 100I according to a modified example as long as they are not contradictory, and a description of overlapping contents will be omitted.

Figure 15:
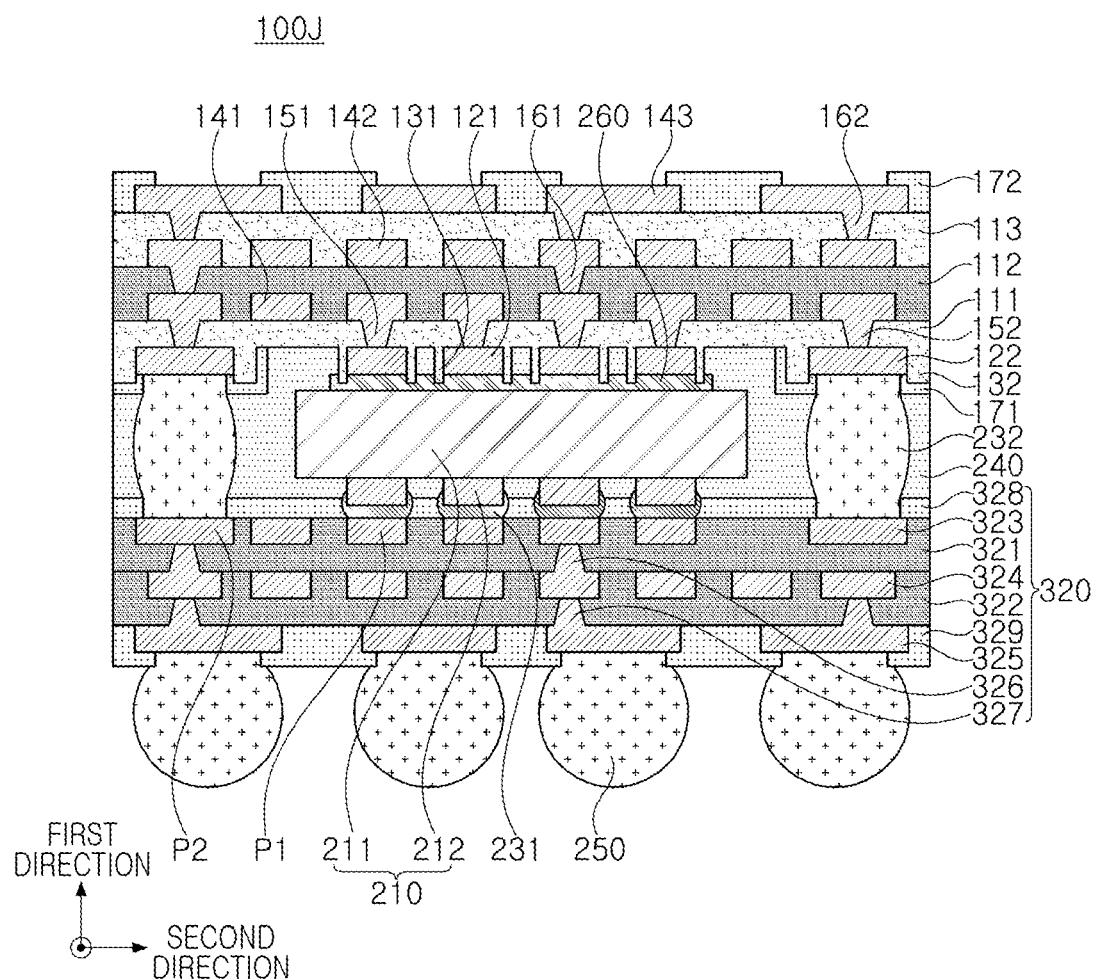
FIG. 15 is a schematic cross-sectional view illustrating another modified example of the printed circuit board of FIG. 12.

FIG. 15 is a schematic cross-sectional view illustrating another modified example of the printed circuit board of FIG. 12.

Referring to FIG. 15, a printed circuit board 100J according to another modified example may have a package structure in which an electronic component 210 is surface-mounted and disposed on a separate wiring board 320 and the above-described printed circuit board 100H is then disposed on the electronic component 210 in a board-on-board form. For example, the printed circuit board 100J according to another modified example may be different from the above-described printed circuit board 100H in that it further includes the wiring board 320 disposed on the first insulating layer 111 and including connection pads P1 and P2 disposed in a center region and a side region thereof and the electronic component 210 disposed between the first insulating layer 111 and the wiring board 320 and having a front surface on which connection terminals 212 are disposed and a back surface opposing the front surface. The connection pads P1 and P2 of the wiring board 320 may be electrically connected to the connection terminals 212 of the electronic component 210 and the second pads 122 through first and second connection members 231 and 232, respectively. The printed circuit board 100J according to a modified example may further include a molding material 240 molding a space between the first insulating layer 111 and the wiring board 320 and/or electrical connection metal 250 connected to the wiring layer 325, if necessary. In addition, the printed circuit board 100J according to another modified example may further include conductive members 260 connecting the first pads 121 and the back surface of the electronic component 210 to each other. The above-described printed circuit board 100H may be used as an upper substrate having a heat dissipation function. Here, the upper board may be an interposer substrate for connection with another package or a package substrate on which another semiconductor die or the like is to be directly mounted.

Other contents, for example, the contents described in the above-described printed circuit boards 100A, 100B, 100C, 100D, 100E, 100G, 100H, and 100I may be applied to the printed circuit board 100J according to another modified example as long as they are not contradictory, and a description of overlapping contents will be omitted.

Figure 16:
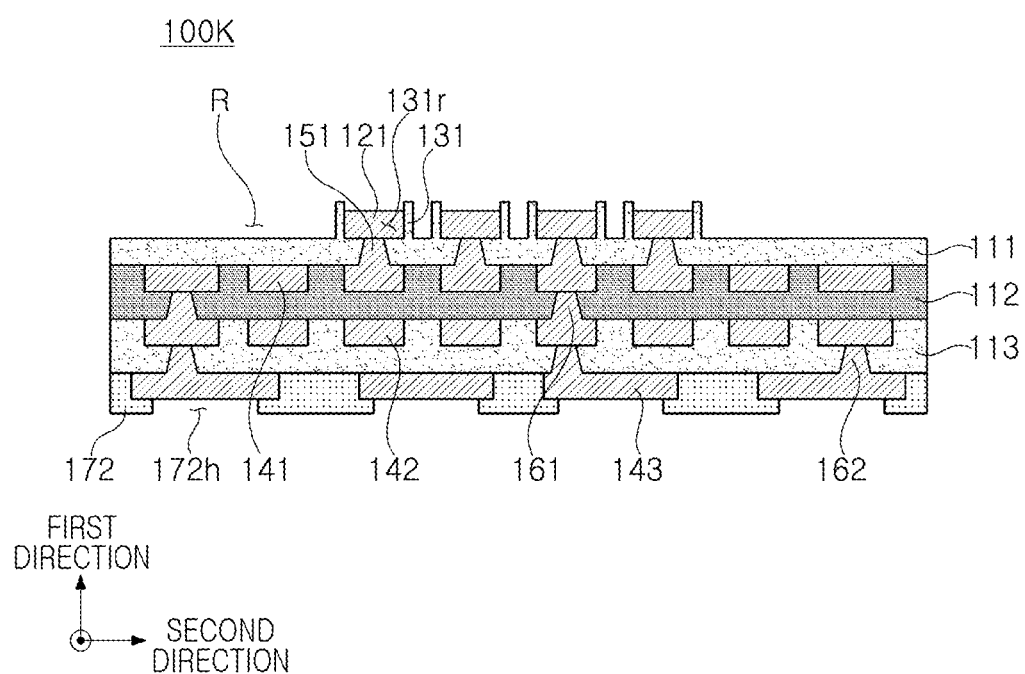
FIG. 16 is a schematic cross-sectional view illustrating another example of a printed circuit board.

FIG. 16 is a schematic cross-sectional view illustrating another example of a printed circuit board.

Referring to FIG. 16, a printed circuit board 100K according to another exemplary embodiment may include a first insulating layer 111, first pads 121 disposed on an upper surface of the first insulating layer 111, and first insulating walls 131 disposed on the upper surface of the first insulating layer 111 and covering side surfaces of the first pads 121.

The printed circuit board 100K according to another exemplary embodiment may further include a first wiring layer 141 disposed on a lower surface of the first insulating layer 111 and/or first connection vias 151 penetrating through the first insulating layer 111 and electrically connecting the first pads 121 to at least portions of the first wiring layer 141, if necessary.

The printed circuit board 100K according to another exemplary embodiment may further include a second insulating layer 112 disposed on the lower surface of the first insulating layer 111 and embedding at least portions of the first wiring layer 141 therein, a second wiring layer 142 disposed on a lower surface of the second insulating layer 112, and/or a first via layer 161 penetrating through the second insulating layer 112 and electrically connecting at least portions of each of the first wiring layer 141 and the second wiring layer 142 to each other, if necessary.

The printed circuit board 100K according to another exemplary embodiment may further include a third insulating layer 113 disposed on the lower surface of the second insulating layer 112 and embedding at least portions of the second wiring layer 142 therein, a third wiring layer 143 disposed on a lower surface of the third insulating layer 113, and/or a second via layer 162 penetrating through the third insulating layer 113 and electrically connecting at least portions of each of the second wiring layer 142 and the third wiring layer 143 to each other, if necessary.

The printed circuit board 100K according to another exemplary embodiment may further include a second passivation layer 172 disposed on the lower surface of the third insulating layer 113 and having second openings 172h exposing at least portions of a surface of the third wiring layer 143, if necessary.

Meanwhile, in the printed circuit board 100K according to another exemplary embodiment, the second pads 122 may be omitted on the first insulating layer 111. In addition, the second insulating walls 132 surrounding the second pads 122 may also be omitted. In addition, the second connection vias 152 connected to the second pads 122 may also be omitted. In addition, the first passivation layer 171 may also be omitted. As such, the printed circuit board 100K according to another exemplary embodiment may have only a center region for mounting a flip-chip die, and components of a side region for a board-on-board structure may be omitted.

Other contents, for example, the contents described in the above-described printed circuit boards 100A, 100B, 100C, 100D, 100E, 100F, 100G, 100H, 100I, and 100J may be applied to the printed circuit board 100K according to another exemplary embodiment as long as they are not contradictory, and a description of overlapping contents will be omitted.

FIGS. 17A to 17H are schematic cross-sectional views illustrating an example of processes of manufacturing the printed circuit board of FIG. 16.

Figure 17A:
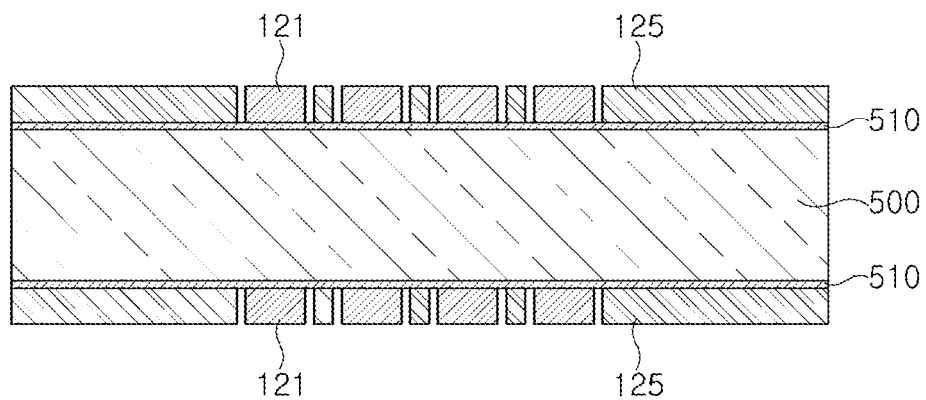
FIGS. 17A to 17H are schematic cross-sectional views illustrating an example of processes of manufacturing the printed circuit board of FIG. 16.

Referring to FIG. 17A, a carrier substrate 500 having metal layers 510 formed on one surface or both surfaces thereof may be prepared, and first pads 121 and conductive patterns 125 may be formed on the metal layers 510 of the carrier substrate 500.

Figure 17B:
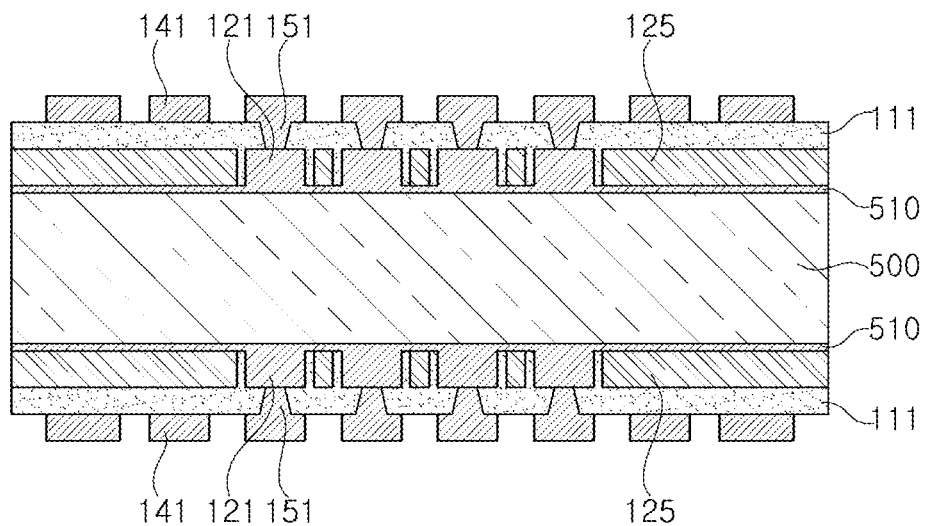

Referring to FIG. 17B, first insulating layers 111 embedding at least portions of each of the first pads 121 and the conductive patterns 125 therein may be formed on the metal layers 510 of the carrier substrate 500. Thereafter, first wiring layers 141 and first via layers 151 may be formed.

Figure 17C:
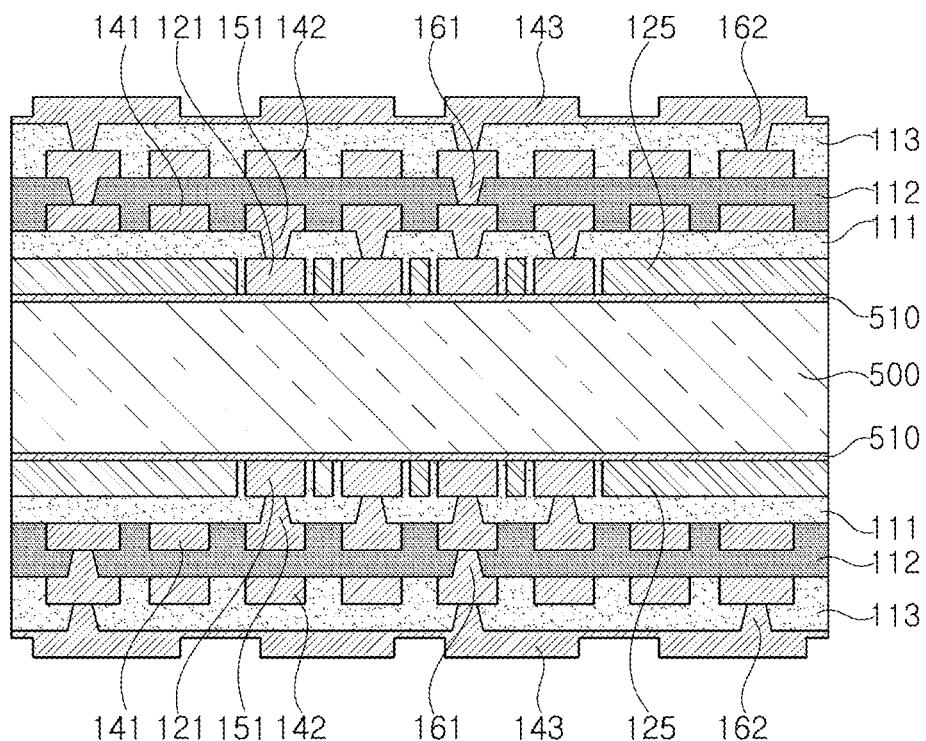

Referring to FIG. 17C, second insulating layers 112 embedding at least portions of the first wiring layers 141 therein may be formed on the first insulating layers 111. Thereafter, second wiring layers 142 and first via layers 161 may be formed. Thereafter, third insulating layers 113 embedding at least portions of the second wiring layers 142 therein may be formed on the second insulating layers 112. Thereafter, third wiring layers 143 and second via layers 162 may be formed.

Figure 17D:
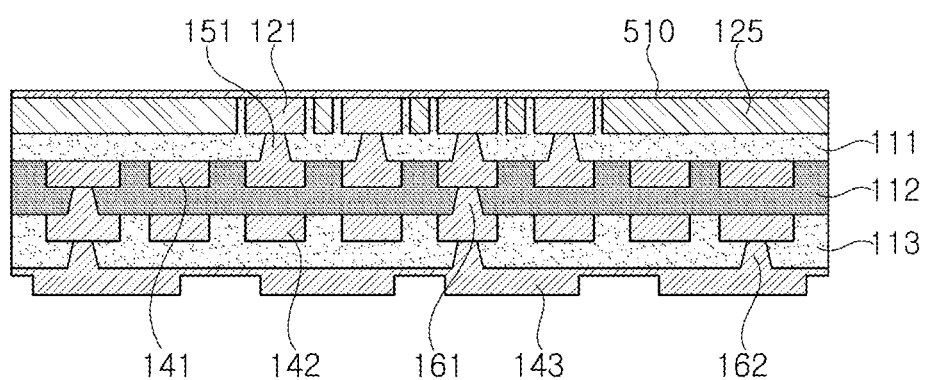

Referring to FIG. 17D, the carrier substrate 500 may be removed. For example, the carrier substrate 500 and the metal layer 510 may be separated from each other.

Figure 17E:
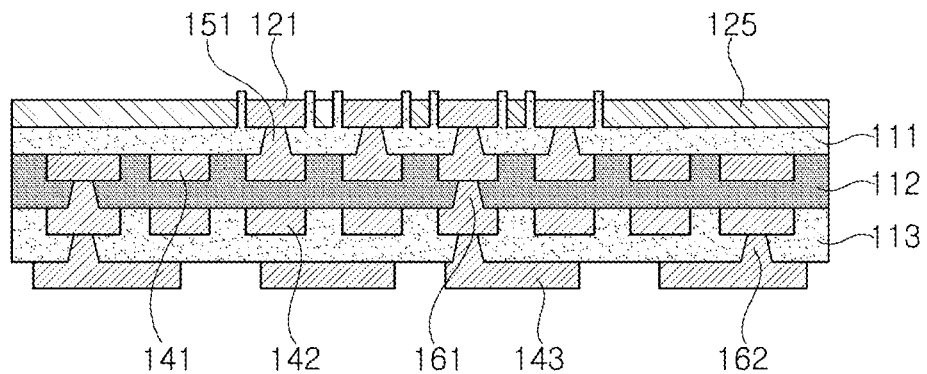

Referring to FIG. 17E, the metal layer 510 may be removed. The metal layer 510 may be removed using, for example, a seed etching process. In this case, a seed layer of the third wiring layer 143 may also be removed together with the metal layer 510.

Figure 17F:
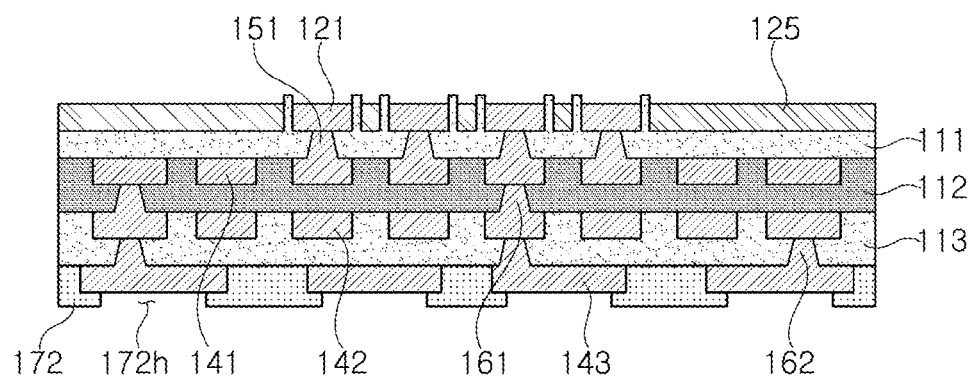

Referring to FIG. 17F, a second passivation layer 172 may be formed. Second openings 172h may be formed by patterning the second passivation layer 172. The second passivation layer 172 may be formed by, for example, a method of forming a solder resist layer and then performing patterning using a photolithography process or the like so as to have the second openings 172h, but is not limited thereto.

Figure 17G:
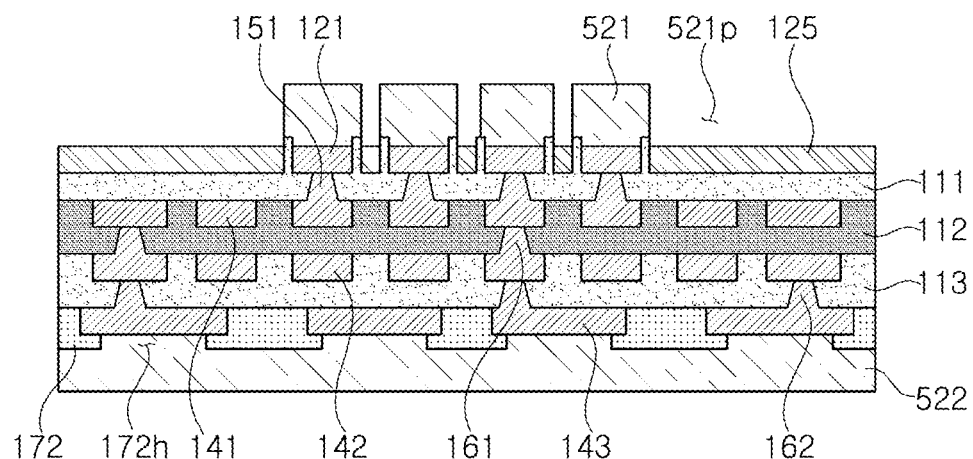

Referring to FIG. 17G, a first dry film 521 may be disposed on the first insulating layer 111. In addition, a second dry film 522 may be disposed on the second passivation layer 172. Thereafter, exposing parts 521p exposing the conductive patterns 125 may be formed by patterning the first dry film 521 by a photolithography process such as exposure and development.

Figure 17H:
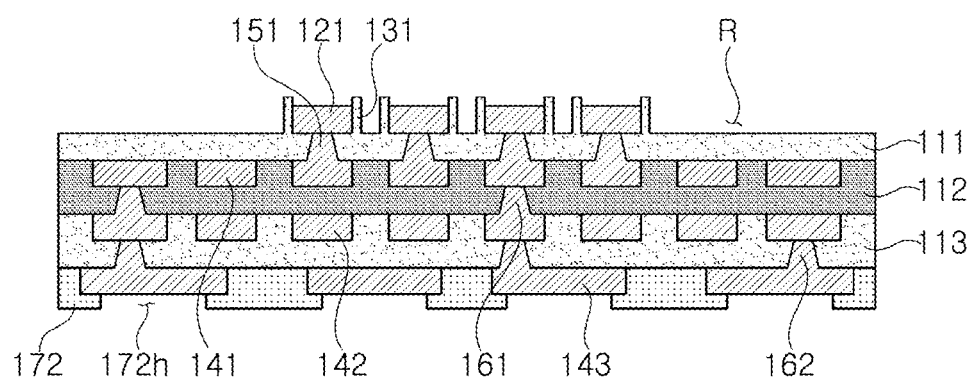

Referring to FIG. 17H, the conductive patterns 125 may be removed. For example, the conductive patterns 125 selectively exposed through the exposing parts 521p may be removed by an etching process. When the conductive patterns 125 are removed, a recess R may be formed. First and second insulating walls 131 and 132 covering side surfaces of the first and second pads 121 and 122 may be formed on the first insulating layer 111 by the recess R. Thereafter, the first and second dry films 521 and 522 may be removed.

The printed circuit board 100K according to another exemplary embodiment described above may be manufactured through the series of processes described above, but this is only one manufacturing example, and the printed circuit board 100K according to another exemplary embodiment described above may also be manufactured by processes different from the processes described above.

Other contents, for example, the contents described in the above-described printed circuit boards 100A, 100B, 100C, 100D, 100E, 100F, 100G, 100H, 100I, 100J, and 100K and the contents described in the examples of the processes of manufacturing the printed circuit boards described above may be applied to the processes of manufacturing the printed circuit board of FIG. 16 as long as they are not contradictory, and a description of overlapping contents will be omitted.

Figure 18:
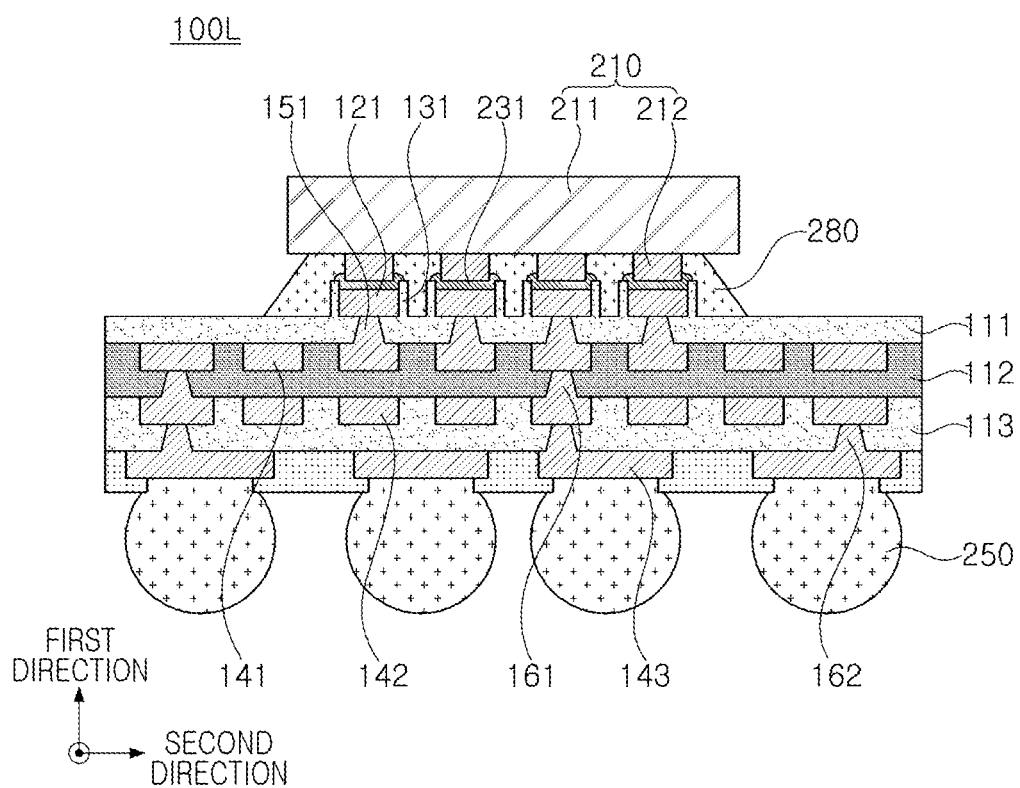
FIG. 18 is a schematic cross-sectional view illustrating a modified example of the printed circuit board of FIG. 16.

FIG. 18 is a schematic cross-sectional view illustrating a modified example of the printed circuit board of FIG. 16.

Referring to FIG. 18, a printed circuit board 100L according to a modified example may have a package structure in which an electronic component 210 are surface-mounted and disposed on the above-described printed circuit board 100K. For example, the printed circuit board 100L according to a modified example may be different from the above-described printed circuit board 100K in that it further includes the electronic component 210 disposed on the first insulating layer 111 and connection terminal 212 electrically connected to the first pads 121 through first connection members 231. The printed circuit board 100L according to a modified example may further include an underfill 280 filling a space between the first insulating layer 111 and the electronic component 210 and/or electrical connection metal 250 connected to the third wiring layer 143, if necessary. The above-described printed circuit board 100K may be used as a package substrate on which only a flip-chip die or the like is to be mounted regardless of a board-on-board.

The underfill 280 may fix the electronic component 210 onto the first insulating layer 111. The underfill 280 may protect the connection terminals 212, the first connection members 231, and the first insulating wall 131 by embedding the connection terminals 212, the first connection members 231, and the first insulating wall 131 therein. The underfill 280 may include an adhesive component such as an epoxy resin, but is not limited thereto, and may include other known materials.

Other contents, for example, the contents described in the above-described printed circuit boards 100A, 100B, 100C, 100D, 100E, 100F, 100G, 100H, 100I, 100J, and 100K may be applied to the printed circuit board 100L according to a modified example as long as they are not contradictory, and a description of overlapping contents will be omitted.

FIGS. 19 to 22 are schematic plan views illustrating various shapes of a plurality of pads and a plurality of insulating walls.

Figure 19:
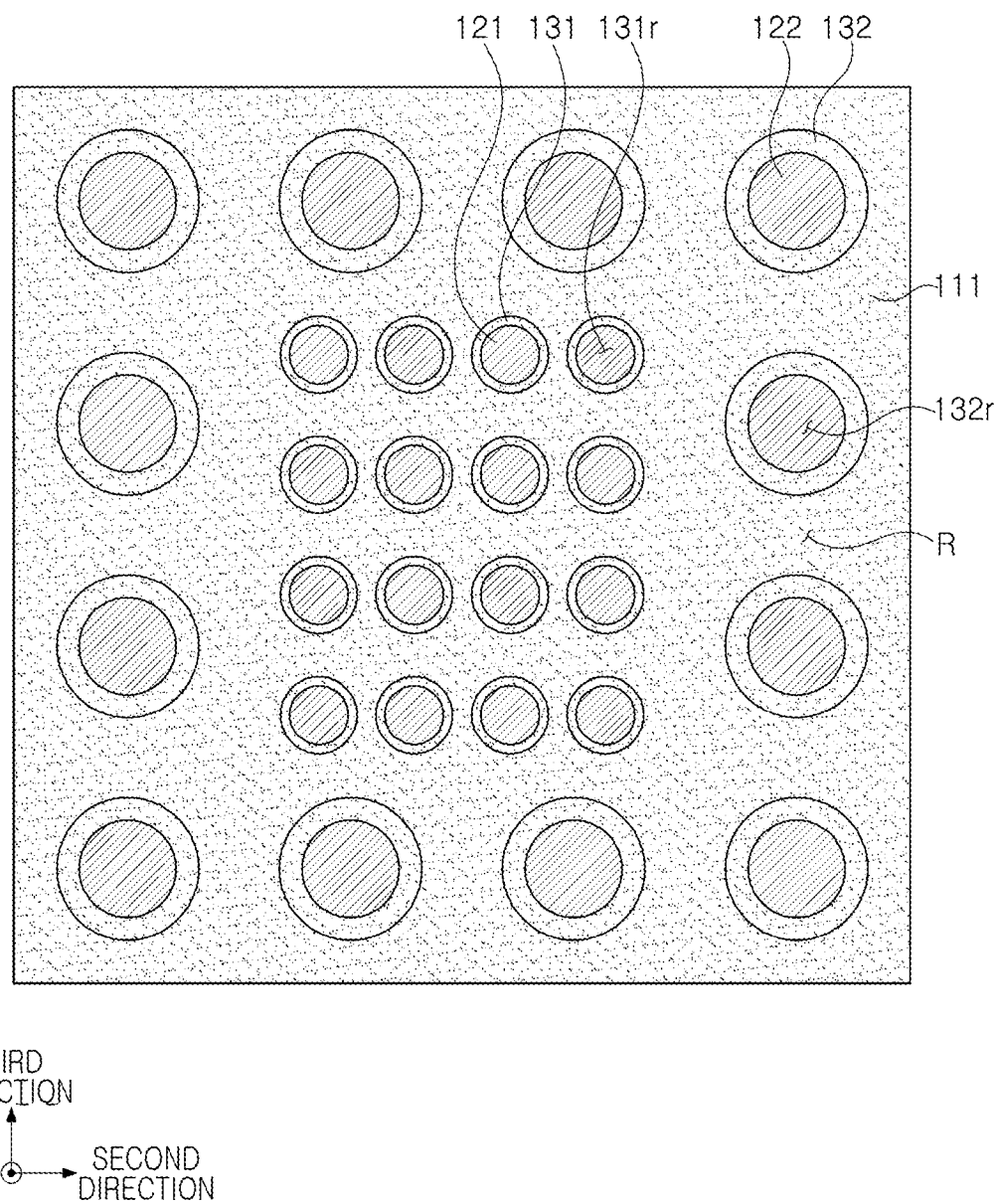
FIGS. 19 to 22 are schematic plan views illustrating various shapes of a plurality of pads and a plurality of insulating walls.

Referring to FIG. 19, in plan view, a plurality of first pads 121 may be disposed in a center region, and a plurality of second pads 122 may be disposed in a side region surrounding the center region. The plurality of first pads 121 may be surrounded by a plurality of first insulating walls 131, respectively. The plurality of second pads 122 may be surrounded by a plurality of second insulating walls 132, respectively. The plurality of first insulating walls 131 may have first cavities 131r in which the first pads 121 are disposed, respectively. The plurality of second insulating walls 132 may have second cavities 132r in which the second pads 122 are disposed, respectively. A single recess R continuous as a whole may exist between the plurality of first insulating walls 131 and the plurality of second insulating walls 132. Each of the plurality of first pads 121 and the plurality of second pads 122 may have a circular shape. Each of the plurality of first insulating walls 131 and the plurality of second insulating walls 132 may have a circular ring shape. Each of the plurality of second pads 122 may have a greater area than each of the plurality of first pads 121. For example, each of the plurality of second pads 122 may have a greater diameter than each of the plurality of first pads 121.

Figure 20:
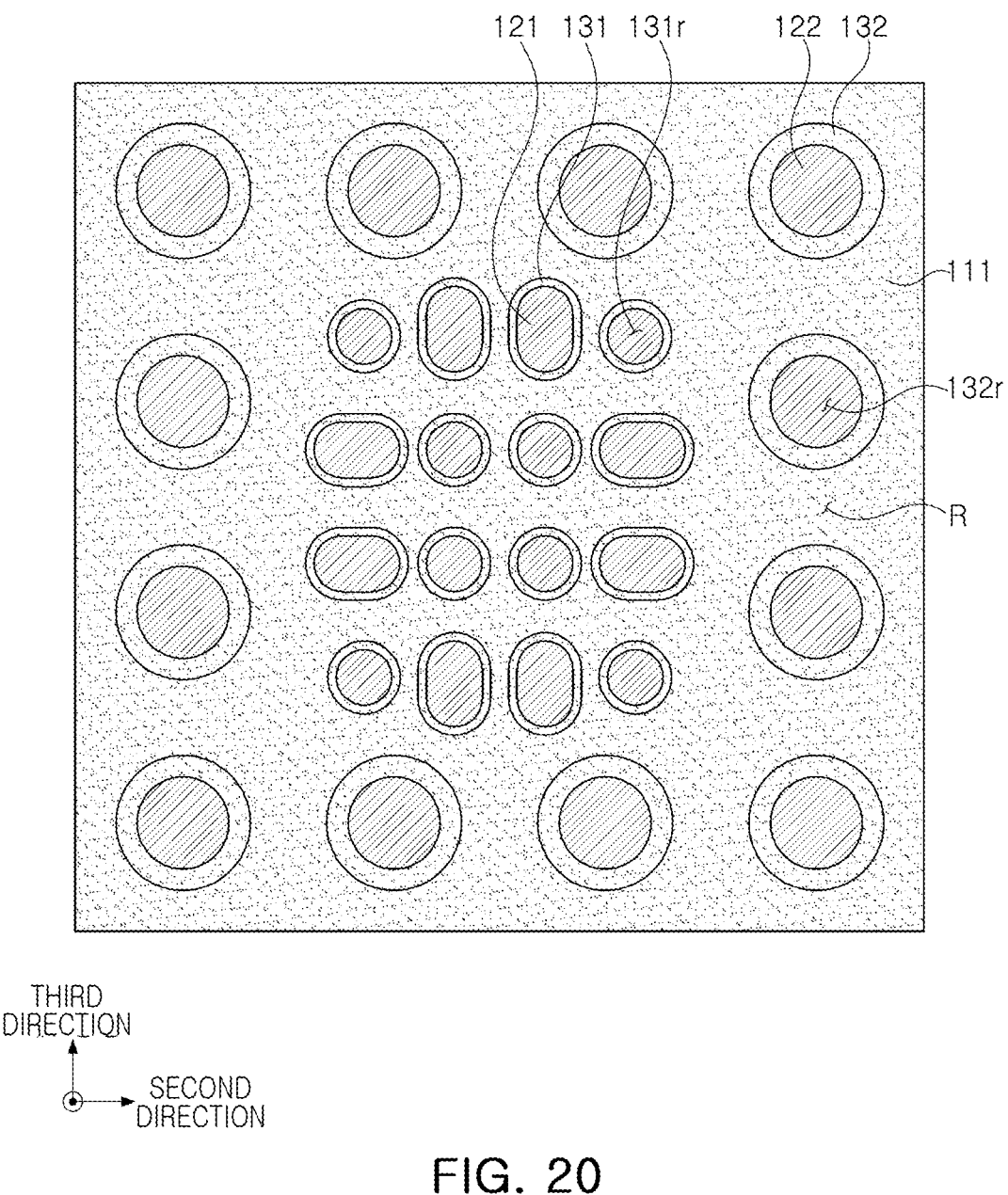

Referring to FIG. 20, in plan view, at least one of the plurality of first pads 121 may have a shape in which a length thereof in any one direction is greater than a length thereof in another direction perpendicular to any one direction. The first insulating wall 131 surrounding such a first pad 121 may also have a ring shape in which a length thereof in any one direction is greater than a length thereof in another direction perpendicular to any one direction. As such, a design in which circular pads and elongated pads are mixed with each other may be applied according to a connection manner of a semiconductor die. That is, various designs may be applied. An elongated pad shape may increase a contact area to improve reliability.

Figure 21:
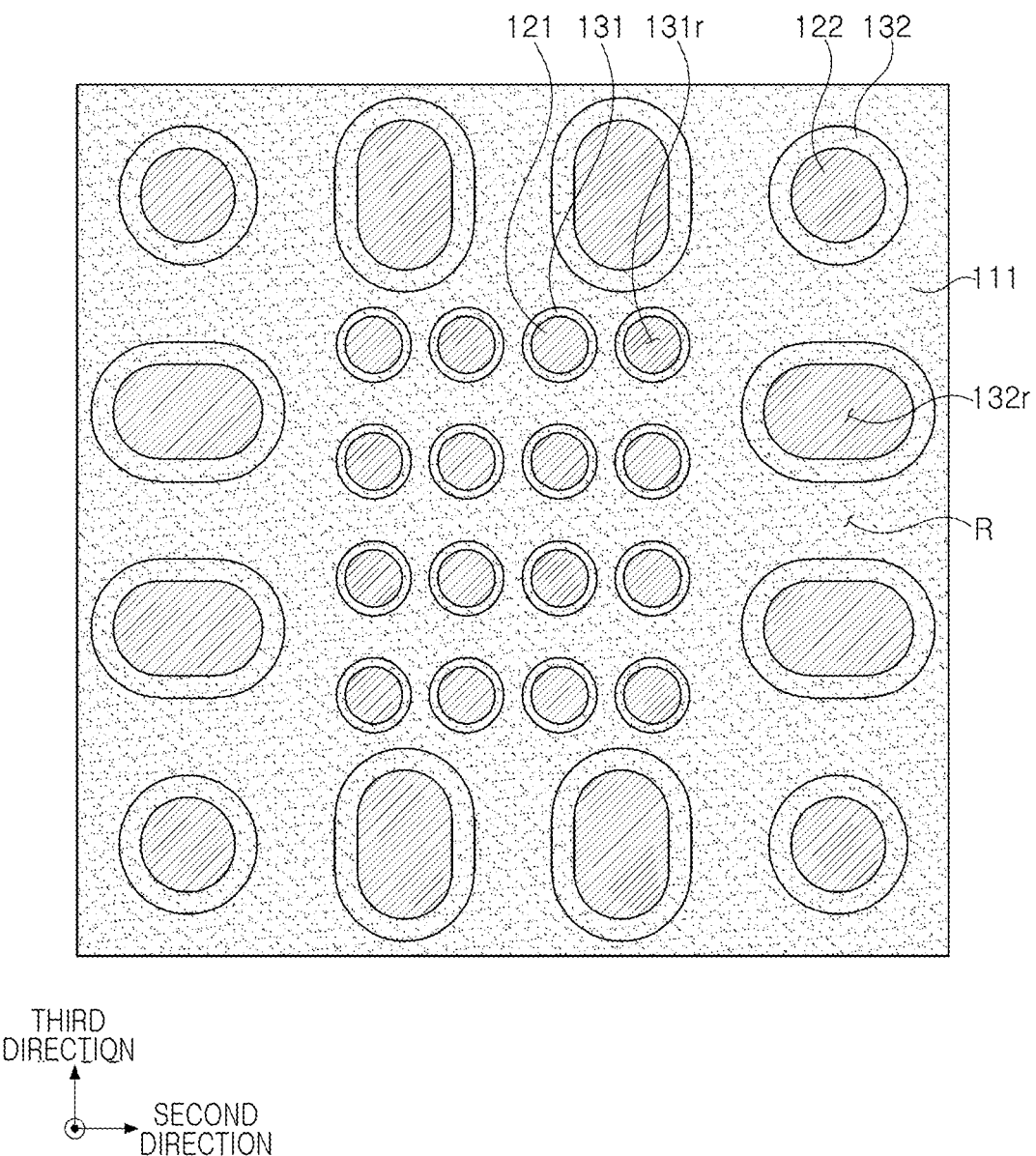

Referring to FIG. 21, in plan view, at least one of the plurality of second pads 122 may have a shape in which a length thereof in any one direction is greater than a length thereof in another direction perpendicular to any one direction. The second insulating wall 132 surrounding such a second pad 122 may also have a ring shape in which a length thereof in any one direction is greater than a length thereof in another direction perpendicular to any one direction. As such, a design in which circular pads and elongated pads are mixed with each other may be applied according to a connection manner of a board-on-board. That is, various designs may be applied. An elongated pad shape may increase a contact area to improve reliability.

Figure 22:
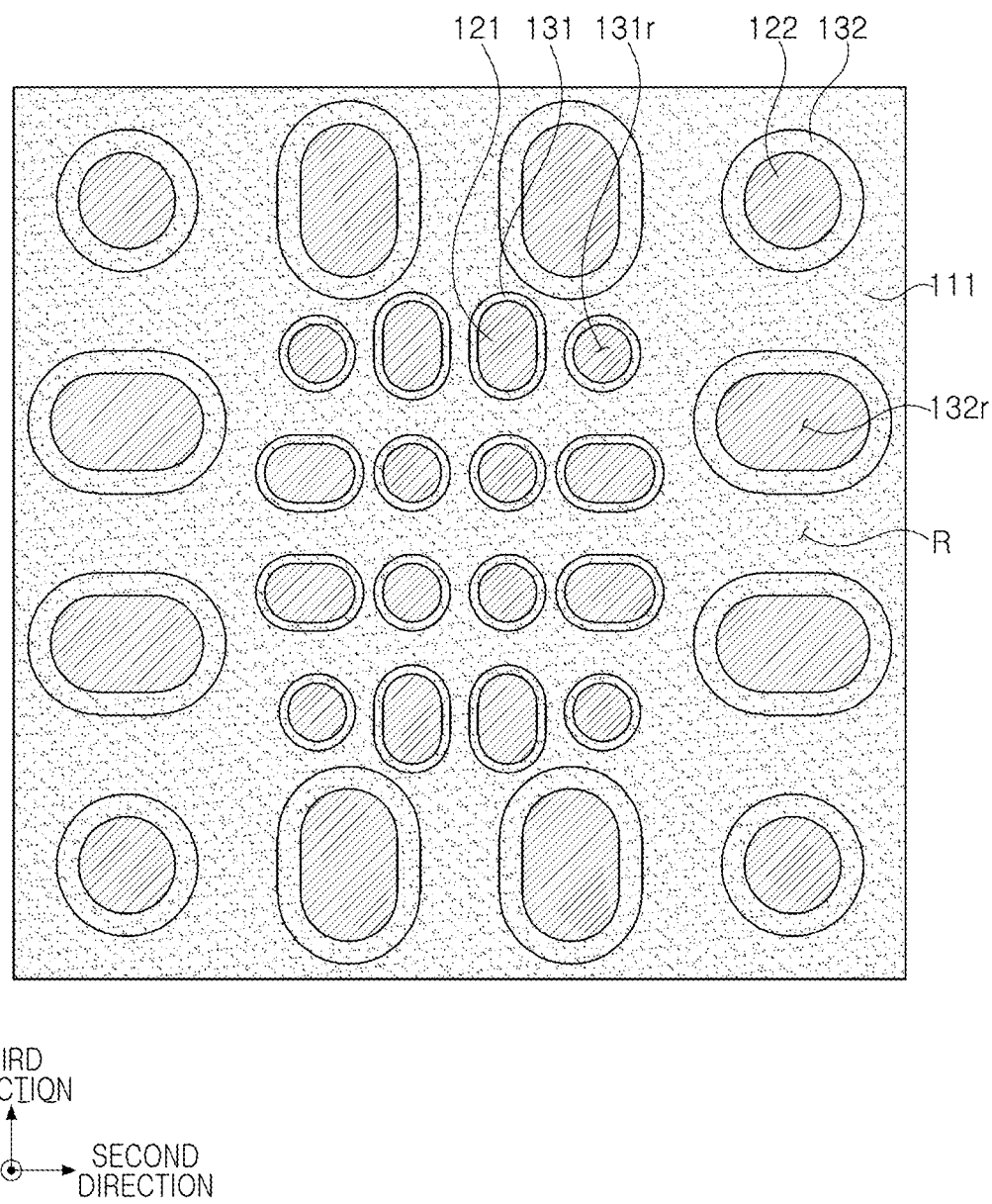

Referring to FIG. 22, in plan view, at least one of the plurality of first pads 121 may have a shape in which a length thereof in any one direction is greater than a length thereof in another direction perpendicular to any one direction. The first insulating wall 131 surrounding such a first pad 121 may also have a ring shape in which a length thereof in any one direction is greater than a length thereof in another direction perpendicular to any one direction. At least one of the plurality of second pads 122 may have a shape in which a length thereof in any one direction is greater than a length thereof in another direction perpendicular to any one direction. The second insulating wall 132 surrounding such a second pad 122 may also have a ring shape in which a length thereof in any one direction is greater than a length thereof in another direction perpendicular to any one direction. As such, a design in which circular pads and elongated pads are variously mixed with each other may be applied. That is, various designs may be applied. An elongated pad shape may increase a contact area to improve reliability.

As set forth above, according to an exemplary embodiment in the present disclosure, a printed circuit board capable of being easily manufactured, and a method of manufacturing the same may be provided.

In addition, a printed circuit board in which a bridge short-circuit risk may be decreased, and a method of manufacturing the same may be provided.

In addition, a printed circuit board in which reliability may be provided, and a method of manufacturing the same may be provided.

While exemplary embodiments have been shown and described above, it will be apparent to those skilled in the art that modifications and variations could be made without departing from the scope of the present invention as defined by the appended claims.

What is claimed is:

1. A printed circuit board comprising:
a first insulating layer;
a plurality of pads disposed on the first insulating layer; and
a plurality of insulating walls that are disposed on the first insulating layer and cover side surfaces of the plurality of pads, respectively, but are not disposed on upper surfaces of the plurality of pads,
wherein in regions outside the plurality of pads, the plurality of insulating walls are disposed to be spaced apart from each other on the first insulating layer.

2. The printed circuit board of claim 1, wherein a recess is disposed between the plurality of insulating walls.

3. The printed circuit board of claim 2, wherein the recess opens at least portions of an upper surface of the first insulating layer.

4. The printed circuit board of claim 1, wherein the plurality of insulating walls are integrated with the first insulating layer without a boundary line therebetween.

5. The printed circuit board of claim 4, wherein the plurality of insulating walls include the same insulating material as the first insulating layer.

6. The printed circuit board of claim 1, wherein each of the plurality of insulating walls is in direct contact with the side surface of each of the plurality of pads, and
each of the plurality of insulating walls is spaced apart from the upper surface of each of the plurality of pads.

7. The printed circuit board of claim 6, wherein each the plurality of insulating walls has each of a plurality of cavities in which each of the plurality of pads is disposed, and which entirely opens the upper surface of each of the plurality of pads.

8. The printed circuit board of claim 1, wherein in plan view, each of the plurality of insulating walls continuously surrounds the side surface of each of the plurality of pads.

9. The printed circuit board of claim 8, wherein in plan view, at least one of the plurality of pads has a greater length in one direction than in another direction perpendicular to the one direction.

10. The printed circuit board of claim 1, further comprising:
a first wiring layer disposed on the other surface of the first insulating layer opposing one surface of the first insulating layer on which the plurality of pads are disposed; and
a plurality of connection vias penetrating through the first insulating layer and connecting the plurality of pads to the first wiring layer, respectively.

11. The printed circuit board of claim 10, wherein in a cross section, each of the plurality of connection vias has a tapered shape of which a width of a surface in contact with each of the plurality of pads is smaller than that of a surface in contact with the first wiring layer.

12. The printed circuit board of claim 10, further comprising:
a second insulating layer disposed on the other surface of the first insulating layer on which the first wiring layer is disposed and embedding at least portions of the first wiring layer therein;
a second wiring layer disposed on the other surface of the second insulating layer opposing one surface of the second insulating layer in which the first wiring layer is embedded, and
a via layer penetrating through the second insulating layer and connecting at least portions of each of the first wiring layer and the second wiring layer to each other.

13. The printed circuit board of claim 12, wherein the first insulating layer and the second insulating layer include different insulating materials.

14. The printed circuit board of claim 1, further comprising an electronic component disposed on the first insulating layer and including at least one connection terminal connected to at least one of the plurality of pads through at least one first connection member.

15. The printed circuit board of claim 1, wherein the plurality of pads include a plurality of first pads and a plurality of second pads,
the plurality of first pads are disposed in a center region on the first insulating layer,
the plurality of second pads are disposed in a side region on the first insulating layer.

16. The printed circuit board of claim 15, wherein in a cross section, a width of each of the second pads is greater than that of each of the first pads.

17. The printed circuit board of claim 15, further comprising a passivation layer disposed on at least one of the plurality of insulating walls and having at least one opening exposing at least a portion of an upper surface of at least one of the plurality of second pads.

18. The printed circuit board of claim 17, wherein at least a portion of the passivation layer extends to at least a portion of a region between the plurality of insulating walls.

19. The printed circuit board of claim 15, further comprising:
    an electronic component disposed on the first insulating layer and including at least one connection terminal connected to at least one of the plurality of first pads through at least one first connection member; and
    a wiring board disposed on the electronic component and including at least one connection pad connected to at least one of the plurality of second pads through at least one second connection member.

20. The printed circuit board of claim 15, further comprising:
    a wiring board disposed on the first insulating layer and including at least one first connection pad disposed in a center region and at least one second connection pad disposed in a side region; and
    an electronic component disposed between the first insulating layer and the wiring board and having a first surface on which at least one connection terminal is disposed and a second surface opposing the first surface,
    wherein the at least one first connection pad and the at least one second connection pad of the wiring board are connected to the at least one connection terminal of the electronic component and at least one of the plurality of second pads through at least one first connection member and at least one second connection member, respectively, and
    at least one of the plurality of first pads is connected to the second surface of the electronic component.

21. A printed circuit board comprising:
    a plurality of pads; and
    an insulating layer covering a lower surface and a side surface of each of the plurality of pads and having a recess disposed between at least a portion of the plurality of pads,
    wherein an upper surface of a portion of the insulating layer which is in contact with the side surface of one of the plurality of pads is disposed on substantially the same level as an upper surface of the one of the plurality of pads or is disposed on a level above the upper surface of the one of the plurality of pads.

22. The printed circuit board of claim 21, further comprising at least one surface treatment layer disposed on an upper surface of at least one of the plurality of pads and including at least one of a nickel (Ni) layer and a gold (Au) layer.

23. The printed circuit board of claim 22, wherein the surface treatment layer entirely covers the upper surface of the at least one of the plurality of pads.

24. A printed circuit board of claim comprising:
    a plurality of pads;
    an insulating layer that covers a lower surface and a side surface of each of the plurality of pads, but does not cover an upper surface of each of the plurality of pads; and
    at least one surface treatment layer disposed on an upper surface of at least one of the plurality of pads,
    wherein an upper surface of a portion of the insulating layer which is in contact with the side surface of one of the plurality of pads is disposed on substantially the same level as the upper surface of the one of the plurality of pads or is disposed on a level above the upper surface of the one of the plurality of pads.

25. The printed circuit board of claim 24, wherein the surface treatment layer includes at least one of a nickel (Ni) layer and a gold (Au) layer.

26. A printed circuit board comprising:
    an insulating layer including a plurality of rings protruding from a surface of a recess in the insulating layer and disposed to be spaced apart from each other to have the recess disposed among the plurality of rings; and
    a plurality of pads disposed in the plurality of rings to contact the plurality of rings, respectively.

27. The printed circuit board of claim 26, wherein the one of the plurality of pads is in contact with a surface of the insulating layer, from which the respective one among the plurality of rings protrudes.

28. The printed circuit board of claim 26, wherein with respect to the surface of the insulating layer, a height of one of the plurality of rings is greater than a height of a respective one among the plurality of pads which is disposed in the one of the plurality of rings.

29. The printed circuit board of claim 26, wherein with respect to the surface of the insulating layer, a height of one of the plurality of rings is substantially the same as a height of a respective one among the plurality of pads which is disposed in the one of the plurality of rings.

30. The printed circuit board of claim 26, wherein a shape of one of the plurality of rings includes a circular ring shape, a quadrangular ring shape, or an elliptical ring shape.

31. The printed circuit board of claim 26, further comprising a plurality of surface treatment layers respectively disposed on the plurality of pads.

32. The printed circuit board of claim 26, further comprising:
    a wiring layer disposed on the other surface of the insulating layer opposing the one surface of the insulating layer from which the plurality of rings protrude; and
    a plurality of connection vias penetrating through the insulating layer and connecting the plurality of pads to the wiring layer, respectively.

33. The printed circuit board of claim 32, wherein one of the plurality of connection vias has a tapered shape of which a width of a surface in contact with a respective one of the plurality of pads is smaller than that of a surface in contact with the wiring layer.

34. The printed circuit board of claim 26, further comprising an electronic component including at least one connection terminal connected to at least one of the plurality of pads through at least one connection member in contact with a respective one of the plurality of rings.

* * * * *